(12) United States Patent
Bossen

(10) Patent No.: US 6,825,782 B2
(45) Date of Patent: Nov. 30, 2004

(54) METHOD AND APPARATUS FOR ARITHMETIC CODING AND TERMINATION

(75) Inventor: Frank Jan Bossen, San Jose, CA (US)

(73) Assignee: NTT Docomo, Inc., Tokyo (JP)

(*) Notice: Subject to any disclaimer, the term of this patent is extended or adjusted under 35 U.S.C. 154(b) by 0 days.

(21) Appl. No.: 10/665,638

(22) Filed: Sep. 18, 2003

(65) Prior Publication Data
US 2004/0056787 A1 Mar. 25, 2004

Related U.S. Application Data
(60) Provisional application No. 60/412,245, filed on Sep. 20, 2002, and provisional application No. 60/415,999, filed on Oct. 4, 2002.

(51) Int. Cl.$^7$ ............................................... H03M 7/00
(52) U.S. Cl. ........................................ 341/107; 702/181
(58) Field of Search ........................... 341/107, 50, 51; 382/244, 247, 233; 702/181

(56) References Cited

U.S. PATENT DOCUMENTS

| | | | | |
|---|---|---|---|---|
| 5,099,440 A | * | 3/1992 | Pennebaker et al. | 702/181 |
| 5,583,500 A | * | 12/1996 | Allen et al. | 341/107 |
| 5,751,859 A | * | 5/1998 | Howard | 382/238 |
| 6,236,759 B1 | * | 5/2001 | Horie et al. | 382/244 |
| 6,411,231 B1 | * | 6/2002 | Yanagiya et al. | 341/107 |
| 6,476,740 B1 | * | 11/2002 | Bengio et al. | 341/107 |
| 6,677,869 B2 | * | 1/2004 | Horie | 341/107 |

OTHER PUBLICATIONS

Yip, US application No. 09/927,316, "Entropy Encoding and decoding" filed on Aug. 13, 2001.*
Horie (US application No. 10/680,152) "an arithmetic decoding method and an arithmetic decoding apparatus", filed on Oct. 8, 2003.*

* cited by examiner

*Primary Examiner*—Jean Bruner Jeanglaude
(74) *Attorney, Agent, or Firm*—Blakely, Sokoloff, Taylor & Zafman LLP

(57) ABSTRACT

Arithmetic encoding and/or decoding are performed using an arithmetic encoder and/or decoder, respectively. The arithmetic decoder may include a sequencer to generate a context identifier for an event of an event sequence, a probability estimator to determine a value for a LPS and a probability estimate for the LPS, and a decoding engine that includes a range register to assign a value to a range for the LPS. The value is based on the probability estimate, a value stored in the range register and the context identifier to a range for the LPS if the context identifier is not equal to an index and the value is not based on the value stored in range register if the context identifier is equal to the index. The decoding engine further determines a value of a binary event based on the value of the range for the LPS and bits from an information sequence.

35 Claims, 18 Drawing Sheets

| State (CTX) | $R_{IDX}$ 0 | 1 | 2 | 3 | State (CTX) | $R_{IDX}$ 0 | 1 | 2 | 3 |
|---|---|---|---|---|---|---|---|---|---|
| 0 | 128 | 176 | 208 | 240 | 32 | 27 | 33 | 39 | 45 |
| 1 | 128 | 167 | 197 | 227 | 33 | 26 | 31 | 37 | 43 |
| 2 | 128 | 158 | 187 | 216 | 34 | 24 | 30 | 35 | 41 |
| 3 | 123 | 150 | 178 | 205 | 35 | 23 | 28 | 33 | 39 |
| 4 | 116 | 142 | 169 | 195 | 36 | 22 | 27 | 32 | 37 |
| 5 | 111 | 135 | 160 | 185 | 37 | 21 | 26 | 30 | 35 |
| 6 | 105 | 128 | 152 | 175 | 38 | 20 | 24 | 29 | 33 |
| 7 | 100 | 122 | 144 | 166 | 39 | 19 | 23 | 27 | 31 |
| 8 | 95 | 116 | 137 | 158 | 40 | 18 | 22 | 26 | 30 |
| 9 | 90 | 110 | 130 | 150 | 41 | 17 | 21 | 25 | 28 |
| 10 | 85 | 104 | 123 | 142 | 42 | 16 | 20 | 23 | 27 |
| 11 | 81 | 99 | 117 | 135 | 43 | 15 | 19 | 22 | 25 |
| 12 | 77 | 94 | 111 | 128 | 44 | 14 | 18 | 21 | 24 |
| 13 | 73 | 89 | 105 | 122 | 45 | 14 | 17 | 20 | 23 |
| 14 | 69 | 85 | 100 | 116 | 46 | 13 | 16 | 19 | 22 |
| 15 | 66 | 80 | 95 | 110 | 47 | 12 | 15 | 18 | 21 |
| 16 | 62 | 76 | 90 | 104 | 48 | 12 | 14 | 17 | 20 |
| 17 | 59 | 72 | 86 | 99 | 49 | 11 | 14 | 16 | 19 |
| 18 | 56 | 69 | 81 | 94 | 50 | 11 | 13 | 15 | 18 |
| 19 | 53 | 65 | 77 | 89 | 51 | 10 | 12 | 15 | 17 |
| 20 | 51 | 62 | 73 | 85 | 52 | 10 | 12 | 14 | 16 |
| 21 | 48 | 59 | 69 | 80 | 53 | 9 | 11 | 13 | 15 |
| 22 | 46 | 56 | 66 | 76 | 54 | 9 | 11 | 12 | 14 |
| 23 | 43 | 53 | 63 | 72 | 55 | 8 | 10 | 12 | 14 |
| 24 | 41 | 50 | 59 | 69 | 56 | 8 | 9 | 11 | 13 |
| 25 | 39 | 48 | 56 | 65 | 57 | 7 | 9 | 11 | 12 |
| 26 | 37 | 45 | 54 | 62 | 58 | 7 | 9 | 10 | 12 |
| 27 | 35 | 43 | 51 | 59 | 59 | 7 | 8 | 10 | 11 |
| 28 | 33 | 41 | 48 | 56 | 60 | 6 | 8 | 9 | 11 |
| 29 | 32 | 39 | 46 | 53 | 61 | 6 | 7 | 9 | 10 |
| 30 | 30 | 37 | 43 | 50 | 62 | 6 | 7 | 8 | 9 |
| 31 | 29 | 35 | 41 | 48 | 63 | 2 | 2 | 2 | 2 |

FIG. 16A

| State(CTX) | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| transIdxLPS | 0 | 0 | 1 | 2 | 2 | 4 | 4 | 5 | 6 | 7 | 8 | 9 | 9 | 11 | 11 | 12 |
| transIdxMPS | 1 | 2 | 3 | 4 | 5 | 6 | 7 | 8 | 9 | 10 | 11 | 12 | 13 | 14 | 15 | 16 |
| State(CTX) | 16 | 17 | 18 | 19 | 20 | 21 | 22 | 23 | 24 | 25 | 26 | 27 | 28 | 29 | 30 | 31 |
| transIdxLPS | 13 | 13 | 15 | 15 | 16 | 16 | 18 | 18 | 19 | 19 | 21 | 21 | 22 | 22 | 23 | 24 |
| transIdxMPS | 17 | 18 | 19 | 20 | 21 | 22 | 23 | 24 | 25 | 26 | 27 | 28 | 29 | 30 | 31 | 32 |
| State(CTX) | 32 | 33 | 34 | 35 | 36 | 37 | 38 | 39 | 40 | 41 | 42 | 43 | 44 | 45 | 46 | 47 |
| transIdxLPS | 24 | 25 | 26 | 26 | 27 | 27 | 28 | 29 | 29 | 30 | 30 | 30 | 31 | 32 | 32 | 33 |
| transIdxMPS | 33 | 34 | 35 | 36 | 37 | 38 | 39 | 40 | 41 | 42 | 43 | 44 | 45 | 46 | 47 | 48 |
| State(CTX) | 48 | 49 | 50 | 51 | 52 | 53 | 54 | 55 | 56 | 57 | 58 | 59 | 60 | 61 | 62 | 63 |
| transIdxLPS | 33 | 33 | 34 | 34 | 35 | 35 | 35 | 36 | 36 | 36 | 37 | 37 | 37 | 38 | 38 | 63 |
| transIdxMPS | 49 | 50 | 51 | 52 | 53 | 54 | 55 | 56 | 57 | 58 | 59 | 60 | 61 | 62 | 62 | 63 |

FIG. 16B

METHOD AND APPARATUS FOR ARITHMETIC CODING AND TERMINATION

PRIORITY

The present patent application claims priority to the corresponding provisional patent application Ser. No. 60/412,245 entitled "TERMINATION OF ARITHMETIC CODING AND BYTE STUFFING," filed Sep. 20, 2002 and provisional patent application Ser. No. 60/415,999 entitled "CABAC CLEANUP AND COMPLEXITY REDUCTION," filed Oct. 4, 2002.

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates generally to information theory, video compression and arithmetic coding. More particularly, the present invention relates to method and apparatus for termination of arithmetic coding and byte stuffing, as well as the creation and use of a state machine during arithmetic coding

BACKGROUND

Data compression is an extremely useful tool for storing and transmitting large amounts of data. For example, the time required to transmit an image, such as a network transmission of a document, is reduced drastically when compression is used to decrease the number of bits required to recreate the image.

Many different data compression techniques exist in the prior art. Compression techniques can be divided into two broad categories, lossy coding and lossless coding. Lossy coding involves coding that results in the loss of information, such that there is no guarantee of perfect reconstruction of the original data. The goal of lossy compression is that changes to the original data are done in such a way that they are not objectionable or detectable. In lossless compression, all the information is retained and the data is compressed in a manner that allows for perfect reconstruction.

Arithmetic coding is a well-known compression technique that is used in some data coding and compression systems to reduce the number of bits or symbols required for transmission. An arithmetic encoder receives an input, which includes a sequence of events (e.g., binary events), or symbols. The encoder encodes the input sequence into a corresponding sequence of bits or bytes. In some cases, fewer data bits are produced at the encoder output than are received at the encoder input, resulting in data compression. An arithmetic decoder may receive or access the encoded data. The arithmetic decoder reads the sequence of encoded data and produces decoded data, which should match the input symbols received at the decoder. Compression is achieved by generating less bits in the information sequences for the events being encoded, where ratios of events to information bits being encoded may reach 64:1 or even 128:1, depending on the probability distribution of the events.

Preferably, decoder operation is symmetric with encoder operation. If the encoder and decoder are symmetric in operation, the number of encoded data bits read at the decoder should match the number of encoded bits produced by the encoder.

In some arithmetic decoders, upon initiating the decoder operation, the decoder reads ahead a group of bits. However, since the decoder reads ahead a group of bits, a mismatch or asymmetry can occur.

One conventional solution to compensate for this asymmetry has been to add extra bits to the encoded data at the encoder. In another convention solution, no additional encoded bits are generated but the decoder is allowed to read ahead in the bitstream of encoded data, then back track.

Both of these conventional solutions introduce inefficiencies. A more efficient solution is desired to reduce the complexity of the coding and decoding algorithms, reduce data for encoding, transmission and decoding and to reduce storage requirements.

SUMMARY OF THE INVENTION

Methods and apparatus for performing a arithmetic encoding and/or decoding are disclosed. In one embodiment, an arithmetic decoder comprises a sequencer to generate a context identifier for an event of an event sequence, a probability estimator to determine a value for a least probable symbol (LPS) and a probability estimate for the LPS, and a decoding engine that includes a range register to assign a value to a range for the LPS. The value is based on the probability estimate, a value stored in the range register and the context identifier to a range for the LPS if the context identifier is not equal to an index and the value is not based on the value stored in range register if the context identifier is equal to the index. The decoding engine further determines a value of a binary event based on the value of the range for the LPS and bits from an information sequence.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIGS. 16A and 16B illustrate an exemplary table to perform a probability estimation lookup.

DETAILED DESCRIPTION OF THE PRESENT INVENTION

Figure 1:
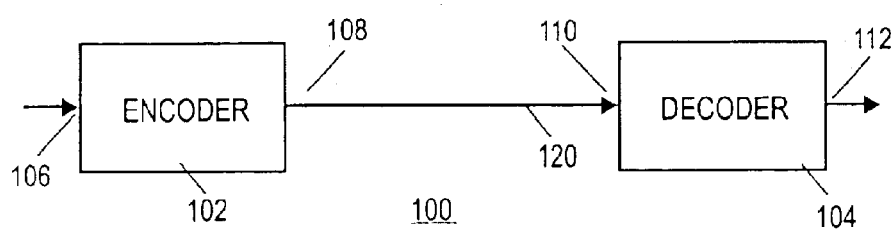
FIG. 1 is a block diagram of an embodiment of a coding and decoding system.

A method and apparatus for encoding and decoding information, particularly video data, are disclosed. During encoding and decoding, an indicator (e.g., end of slice) is used to signal the end of events being arithmetically encoded. In one embodiment, also during encoding of information, bits or bytes of stuffing information are added to the bitstream of encoded data generated by an encoder. Instead of stuffing these additional bits into the middle of the bitstream of encoded data, stuffing bytes (or bits) are appended to the end of the encoded data. Such stuffing may be used to maintain a relationship between a number of events being encoded, a number of blocks of video data (e.g., macro blocks), and the size of the information sequence being generated.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Encoding and Decoding System Overview

FIG. 1 is a block diagram of an embodiment of a coding and decoding system 100. Referring to FIG. 1, system 100 includes an encoder 102 and a decoder 104 in communication over a channel 120. Alternatively, system 100 may include only encoder 102 or decoder 104.

Channel 120 may be any suitable data communication channel, including wired and wireless channels or combinations thereof. Any appropriate data communication and modulation schemes may be used in channel 120. One example of system 100 is a system for encoding, compression and decoding of video data including a sequence of pictures. In one embodiment, each of the pictures is partitioned into one or more slices.

Encoder 102 has an input 106 to receive input information, such as input data (e.g., video information). In one embodiment, encoder 102 encodes the data using arithmetic coding. Accordingly, encoder 102 may include data storage, manipulation registers, and an arithmetic coding engine. In one embodiment, encoder 102 includes a Range register, or R register, and a Low register, or L register. Further, in one embodiment, encoder 102 includes a probability estimation state machine. The coding algorithm performed by encoder 102 may be context adaptive binary arithmetic coding, referred to herein as CABAC, which is well known in the art. Also, the techniques and structures described herein may be extended to other coding and decoding algorithms and procedures as well. Encoder 102 has an output 108 for providing encoded data to channel 120.

In one embodiment, encoder 102 generates a bitstream of encoded data that includes an encoded event (e.g., decision)

indicating the termination of arithmetic coded data. In one embodiment, the event indicating termination of arithmetic coded data comprises an end of slice flag. The bitstream may also include stuffing bytes (or bits) as described in more detail below.

Decoder 104 has an input 110 to receive the encoded data from channel 120 and an output 112 to provide decoded data. In one embodiment, operation of decoder 104 to decode the encoded data is generally symmetric with the encoding operation of encoder 102. Note that system 100 may include more than one encoder and/or more than one decoder.

Encoder 102 and decoder 104 may be utilized in the processing of video data, such as, for example, video data generated by a video processor (e.g., video codec). In one embodiment, a video image is recorded, and partitioned into sample blocks of data that may represent 16×16, 8×8, or 4×4 samples of the recorded image. The blocks are then transformed by the video processor (e.g., utilizing a discrete cosine transform), and quantized to yield integer values representing the sample block. The integer values are converted to a sequence of events (e.g., binary events) by the video processor and sent to the encoder for encoding. Alternatively, the video processor may operate directly on individual samples, including transforming and quantizing the samples, and converting the particular quantized integer value for the sample to a sequence of events.

Figure 2:
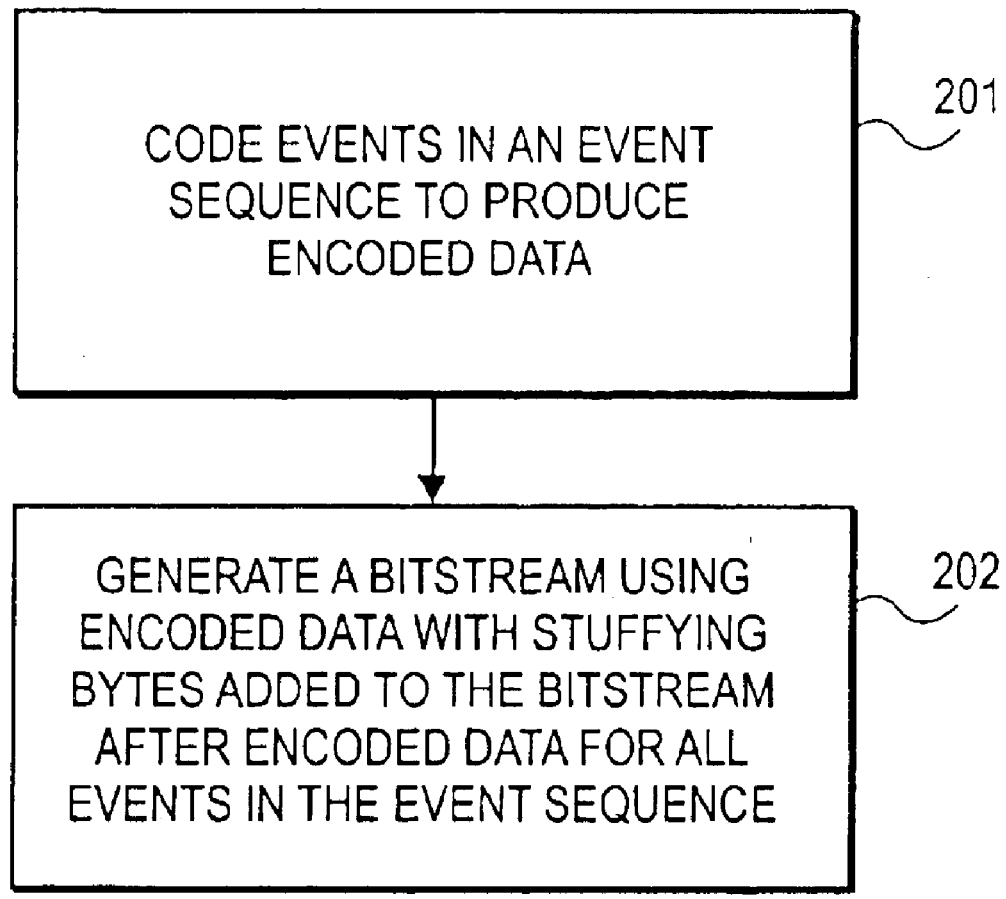
FIG. 2 is a flow diagram of an encoding process for generating a bitstream.

FIG. 2 is a flow diagram of an encoding process for generating a bitstream. The process is performed by processing logic that may comprise hardware (e.g., circuitry, dedicated logic, etc.), software (such as is run on a general purpose computer system or a dedicated machine), or a combination of both.

Referring to FIG. 2, processing logic codes events in an event sequence to produce encoded data (processing block 201). The events may be binary decisions. The events may also be from the same slice. In one embodiment, one of the events indicates the termination of arithmetic coding (e.g., an end of slice). Then processing logic generates a bitstream with the encoded data for all the events followed by stuffing bytes (or bits) (processing logic 202). The stuffing bytes (or bits) may be put in the bitstream after an encoded indicator that indicates the termination of arithmetic coding.

Figure 3:
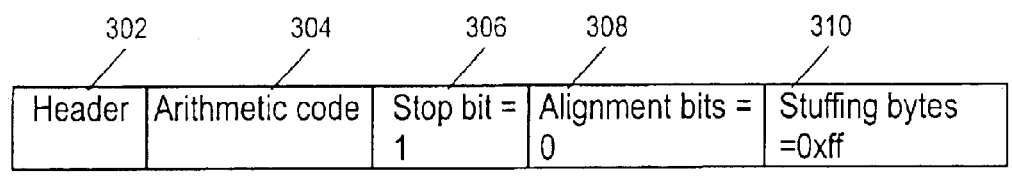
FIG. 3 illustrates an exemplary data format by which encoded data may be transmitted in the system of FIG. 1.

FIG. 3 illustrates an exemplary data format 300 by which encoded data may be transmitted in a system such as the system in FIG. 1. Format 300 includes a header 302, an arithmetic code 304, one or more stop bits 306, zero, one, or more alignment bits 308 and zero, one or more stuffing bytes 310. In an alternative embodiment, zero, one or more stuffing bits may be used instead of bytes.

As noted above, the system of FIG. 1 and the data format of FIG. 3 may be used for encoding and transmitting video information, including data related to a sequence of pictures. In one embodiment, a picture is partitioned into one or more slices, where a slice contains one or more macro blocks that are arrays of 16×16 pixels. Each slice may be coded independently of other slices within the picture. The picture data is encoded in the format illustrated in FIG. 3.

In one embodiment, header 302 begins at a byte boundary and contains data coded using either fixed-length or variable-length codes (e.g., Huffman coding). Header 302 may be a slice header. As a slice header, header 302 may be preceded by a start code (SC) and an indicator that identifies the type of slice data that follows.

Arithmetic code 304 is a sequence of bits generated by an arithmetic coding engine of an encoder such as encoder 102 (FIG. 1). In one embodiment, the sequence of bits start at a byte boundary. One or more stop bits 303 follows arithmetic code 304. In an alternate embodiment, stop bit 303 may be included in arithmetic code 304. A number (0 to 7) of trailing alignment bits 308 follows stop bits 306 and, in one embodiment, guarantees byte alignment of the stuffing bytes 310. The number of stuffing bytes 310 appended to the data may be zero bytes, one byte or more than one byte, depending on the number of bytes required to maintain the relationship between the number of events being encoded, the number of blocks of video data (e.g., macro blocks), and the size of the information sequence being generated.

Codestream Termination

In one embodiment, the encoder encodes an event (e.g., decision) that indicates termination of arithmetic coded data to a decoder. This termination of arithmetic coded data may be indicated when an end of slice has been reached. The termination of arithmetic coded data may also occur when arithmetic coded data in a bitstream stops and is followed by non-arithmetic coded data.

Referring back to FIG. 3, in one embodiment, for each macro block in a slice, arithmetic code 204 typically contains the following data: a macro block mode, optionally motion vectors and transform coefficients, and also an end_of_slice_flag. The end_of_slice_flag enables decoder 104 (FIG. 1) to determine when the last macro block in a slice has been decoded. This flag is used since the last bit of the arithmetic code may contain data describing more than one macro block.

Benefits of coding the termination of arithmetic coded data may be explained by examining conventional implementations. In conventional implementations, termination of an arithmetic encoder usually is done according to one of two alternatives. In a first approach, the whole register L is transmitted. In a second approach, an offset is added to the contents of the register L and only the most significant bits of the register L are transmitted. The advantage of the first approach is that the decoder reads exactly the same number of bits as generated by the encoder. However, this comes at the expense of sending extra bits. In the second approach, bits are saved but the decoder reads more bits than were generated by the encoder. This may be overcome by padding the bitstream in the decoder.

An approach disclosed herein offers the best of both worlds: the decoder reads the same number of bits as generated by the encoder without having the encoder sending more bits than are necessary. This is enabled by the fact that an event, the end_of_slice_flag, is coded to signal the end of a slice. Given a well defined probability assigned to this event, a decoder can decode it, but can then forego renormalization if the outcome of the event signals termination. That is, normally, during encoding, for every symbol that is encoded, the value R is multiplied by the probability to get a subinterval. Thereafter, renormalization is performed to bring the value of R back into a range of values. Renormalization is well known to those skilled in the art of arithmetic coding. Foregoing renormalization ensures that the number of bits read matches the number of bits generated by the encoder.

In one embodiment, the probability assigned to an end_of_slice event (or other events indicating termination of the arithmetic coding) is defined by a number assigned to the register R during termination of encoding, before any renormalization is performed. In one embodiment, to ensure that the encoder and decoder are synchronized, for the end of slice flag, the calculation of the subinterval is not performed by multiplying the value stored in R by the probability. Instead, the subinterval is assigned a fixed value, or constant.

In one embodiment, a fixed value of 2 is used. More generally, the value should be independent of the value of the contents of register R before coding the end_of_slice_flag. This is done for the last symbol (bit) that is put into the bitstream. By setting the subinterval to a value of 2, the value of 1 can be added to the value of the register L without affecting decoder operation. This allows the contents of the entire low (L) register to be sent into the bitstream. Because the contents of the entire register L are sent, no renormalization is necessary in this instance.

In one embodiment, the least significant bit of register L is set to 1 before sending the contents of L. Setting the least significant bit of register L to 1 is equivalent to adding 1 to L if its least significant bit is zero. Thus, the last bit generated by the arithmetic encoder is equal to 1 and the last byte of the bitstream containing the arithmetic code has a non-zero value. In effect, the least significant bit of register L becomes a stop bit.

Adding Stuffing Bytes

In one embodiment, the encoder inserts stuffing bytes, or bits, into a bitstream of compressed data. In one embodiment, the stuffing bytes are inserted after the arithmetic code for a slice, following a stop bit and zero, one or more alignment bits. Alignment bits are added to ensure any added stuffing bytes are inserted at byte boundaries. One of the benefits of placing the stuffing bytes after the stop bit is that a decoder will not have to decode the stuffing bytes. Therefore, the decoder decodes on the same number of bits as the number of bits of encoded data generated by the encoder.

In one embodiment, the number of stuffing bytes inserted into the compressed bitstream is based on maintaining a relationship between the number of events being input into the encoder, the number of blocks of data, and the number of bits being output from the encoder. The relationship is described in more detail below.

In one embodiment, the stuffing bytes have a specific pattern. The pattern may be unique such that a decoder is able to determine that the stuffing bytes are present by identifying bits with this particular pattern following a stop bit and one or more alignment bits. Once such a determination is made, the decoder doesn't have to decode the stuffing bytes. In one embodiment, the decoder includes demultiplexing functionality that prevents the stuffing bytes from being sent to an arithmetic decoding engine in the decoder, in a way similar to the header bits (which are not sent to a decoding engine).

In one embodiment, the pattern of the stuffing bits is the three byte sequence 000003 Hex, which is appended to the bitstream. The first two bytes represent a zero word (0000) and the third byte (03) is recognized by the decoder after an end of slice to identify the bytes as stuffing bytes.

In one embodiment, the number of stuffing bytes 310 stuffed at the end of a slice guarantee that the relationship between the number of arithmetic decode operations and the number of bits is less or equal to four. An encoder, such as encoder 102 of FIG. 1, may use a register C to count or otherwise keep track of the ratio of events (decode operations) to bits (or bytes). Each time an event is processed, the counter C is incremented by 1, and each time a bit is produced, the counter C is decremented by 4 (or by 32 for each produced byte). In one embodiment, the counting takes into account all bits in the slice (or other set of events), including header and trailing stop and alignment bits.

Note that in one embodiment decoding operations for the end_of_slice_flag are not counted with counter C (although in an alternative implementation they may be counted). It is known, however, that there is one such event per macro block and the number of such events is well bounded by the picture size. In this case, not counting end_of_slice_flag events is equivalent to counting them (hence incrementing C by 1 once per macro block), but at the same time decrementing C by 1 every 256 pixels (once per macro block). Alternatively, C could be decremented by any value for each macro block.

In one embodiment, appending stuffing bytes in the manner described herein guarantees a minimum length for the encoded slice. Relative to the conventional technique of inserting stuffing bits in the middle of an encoded slice, this advancement simplifies the rules by which the encoder encodes data, in particular, defining how much data to encode.

The encoder may constrain the number of events of the sequence of events as a function of the number of information bits in the sequence of information bits, and a number of segments, or blocks, of the input data represented in the sequence of events. For example, the constraining may take the form of a linear combination:

$$e \leq \alpha B + \beta S,$$

where e is the number of events represented in the sequence of information bits (or other elements), B is a number of information bits in the sequence of information bits (or other elements), S is a number of segments (e.g., macro blocks) represented in the sequence of events, and $\alpha$ and $\beta$ represent a decrement value to a counter to substantially maintain a constraint of the number of events of the sequence of events with respect to a number of information bits generated and to a number of segments processed.

The values for $\alpha$ and $\beta$ are typically provided to a controller for an arithmetic coder, and the derivation of $\alpha$ and $\beta$ will be discussed below. The value $\alpha$ may represent a decrement value to, for example, a counter upon generation of an information bit at the coder, where the value $\beta$ may represent decrement value to, for example, a counter upon completion of processing a block of data. In the alternative, the value $\beta$ may be decremented from a counter value at the beginning of processing of a segment, or at any other time during the processing of a block of data as would be apparent to one skilled in the art.

Since the total number of blocks, S, and the value $\beta$ are known, the product of $\beta \times S$ may be subtracted from the number of events, e, for the sequence of events after processing of the blocks (e.g., macro blocks) of the input data. For example, where a counter is utilized to constrain the number of events responsive to the number of bits that have been generated, the counter may initially be decremented by a value of $\beta \times S$, and may be decremented by a value $\alpha$ for each information bit generated, while the counter is incremented by "1" for each event of the sequence of events processed by the entropy encoder.

The value of $\beta$ may be any value, typically in the range of 1 to 100, and may be determined, for example, as described further below. The value of $\alpha$ may be any value, typically in the range of 1 to 10, and may be determined, for example, as described further below.

In some circumstances, a number of blocks of the input data to be processed is not known in advance, for example, where the communication medium limits the number of information bits that may be provided in the information sequence. This may occur, for example, where the information sequence is to be transmitted over the Internet, as an Internet Protocol (IP) packet, where the IP packet has a maximum size limitation. In these circumstances, depending on the complexity of a particular image, one or more sequences of information bits may be required to represent a single image of the input data. However, the number of blocks utilized for generation of a sequence of information bits may not be know in advance, since it may not be known after how many processed segments the maximum size of a sequence of information bits will be reached. Where a number of segments of the input data to be processed is not known in advance, the controller may account for the sequences of events as the one or more blocks representing a particular sequence of events is encoded. For example, where a counter is utilized to constrain the number of events responsive to the number of bits that have been generated, the counter may be decremented by a value $\beta$ for each block processed, and may be decremented by a value $\alpha$ for each information bit generated, while the counter may be incremented by "1" for each event of the sequence of events processed by the entropy encoder.

The values of $\alpha$ and $\beta$ may be determined in advance, by a system designer of the encoder accounting for one or more of the limitations discussed above, and provided to the controller. Alternatively, or in addition, the values of $\alpha$ and $\beta$ may be determined by the controller, or any other component of the encoder, in accordance with one or more of the limitations discussed above, or as encoder default values. Where the controller determines values for $\alpha$ and $\beta$ using one or both of the limitations imposed by the standard or by a decoding device, the information regarding one or more of the limitations may be stored at a memory (not shown) of the controller, and used by the controller in determining the $\alpha$ and $\beta$ values. Additionally, or in the alternative, information regarding the limitations may be provided to the controller, for example, by some external device such as an external memory (i.e. a Digital Video Disc (DVD)), a DVD player device, or from a systems engineer, for example, handling some of the functions with regards to encoding the particular input data. In the latter case, the systems engineer may enter into a console or other input device (not shown), or otherwise specify, information with regards to limitations imposed as a result of an encoding standard and/or a decoding device, as would be appreciated by one skilled in the art.

In addition, when determining the values for $\alpha$ and $\beta$, considerations may be made as to whether the complexity constraint is too tight, for example, the values for $\alpha$ and/or $\beta$ are too low. A high proportion of stuffing information bits at the end of the sequence of information bits (i.e., a number of stuffing bytes (or bits) greater than approximately 1% or 2% of the information bits of the information sequence) may indicate that the constraint it too tight. One skilled would realize that other proportions may indicate a high proportion of stuffing information bits, for example, taking into account the particular standard and/or decoder that may be used.

Where it is determined, for example, that the values for $\alpha$ and $\beta$ are too tight, the values for $\alpha$ and $\beta$ may be increased to reduce the likelihood that stuffing bytes will be added (i.e. reducing the likelihood of a quality penalty in the encoded information sequence). When increasing the values for $\alpha$ and $\beta$, considerations may be made as to the effect on the resulting complexity bounds with respect to a decoder that will be utilized to decode the encoded information sequence. Such considerations may include the cost to implement the decoder. If the complexity bound is higher, more processing power may be required in the decoder. An increase in required processing power could likely result in higher implementation cost. Note that in one embodiment the changes to $\alpha$ and $\beta$ may be made after encoding data from each macro block.

The values $\alpha$ and $\beta$ may be determined experimentally, using linear regression techniques. A number of sequences of events, each representing S segments, may be encoded without enforcing any complexity constraint. For each sequence z of events, it is known for the number of events e(z), the number of resulting generated information bits B(z). It may be determined, using linear regression, a line e+c*B+d that approximates the data pairs (e(z), B(z)). An initial value of $\alpha$ and/or $\beta$ may then be increased such as to reduce, and potentially minimize, the number of date pairs (e(z),B(z)) that lie above the line e=$\alpha$*B+$\beta$*S.

Utilizing the values for $\alpha$ and $\beta$ as determined by one or more of the various techniques discussed above, the encoder may account for a value of $\alpha$ (i.e. decrement a counter by the value of $\alpha$) for each information bit generated, and may account for a value of $\beta$ (i.e., decrement a counter by the value of $\beta$) upon completion of a segment of the input data. For example, where $\alpha$ and $\beta$ are integer values, such accounting (i.e. decrements to one or more counters) may be accomplished directly.

Where, for example, one or both of $\alpha$ and $\beta$ are fractional values, a common denominator may be determined to provide non-fractional values for $\alpha$ and $\beta$. In this circumstance, the newly, non-fractional values for $\alpha$ and $\beta$ may be accounted for as described above, for example, by decrementing a counter by the values of $\alpha$ and $\beta$ upon information bit generation and completion of segment processing, respectively. The determined common denominator may be accounted for, for example, by adding the value of the common denominator to the counter value upon processing of each event of the event sequence. For example, where the values for $\alpha$ and $\beta$ are determined to be $\frac{4}{3}$ and 25 respectively, a common denominator may be determined as 3. Non-fractional values for $\alpha$ and $\beta$ may thus be determined as 4 and 75 respectively, using the common denominator. Thus, where a counter is utilized to account for the values of $\alpha$ and $\beta$, the counter may be decremented by 4 for each information bit generated, decremented by 75 upon completion of processing each segment, and incremented by 3 for each event processed.

Exemplary Encoder Operation

Figure 4:
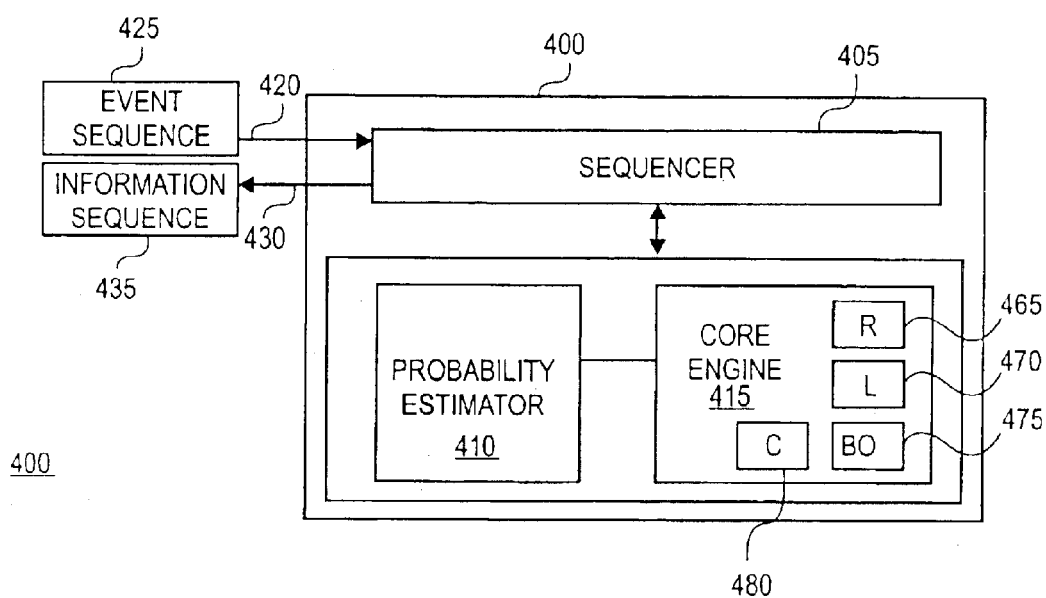
FIG. 4 illustrates a block diagram of one embodiment of an arithmetic encoder.

FIG. 4 illustrates a block diagram of one embodiment of an arithmetic encoder. Referring to FIG. 4, arithmetic encoder 400 includes a sequencer 405, a probability estimator 410, and a coding engine 415, which are each coupled with one another. One or more input data lines 420 provide an input port for receiving a sequence of events 425 (e.g., an ordered sequence of binary events) to encoder 400. The event sequence is processed by encoder 400, as described below, to generate an information sequence. In one embodiment, the information sequence is an ordered sequence comprised of at least one information element (e.g., bit). In one embodiment, the number of information bits in the information sequence is less than the number of events in the event sequence. Output 430 provides an output port for sending information sequence 435 from encoder 400. The ordered sequence of bits of the information sequence includes one or more bits having a value of "0" or "1."

Upon receiving event sequence 425, sequencer 405 sequentially transmits events 425 to both probability estimator 410 and coding engine 415. For each binary event of event sequence 425, sequencer 405 also transmits context information to probability estimator 410 for the binary event. Probability estimator 410, using the context information received, generates a probability estimate P(A) that is transmitted to the coding engine 415. In one embodiment, probability estimator 410 sends multiple probability estimates to coding engine 415 and coding engine 415 selects one of the probability estimates based on the R value. Alternatively, the R value may be sent to probability estimator 410, which uses it to select one probability estimate to be sent. Probability estimator 410 then updates its internal state based on the value of the received binary event. Coding engine 415 produces 0 or more information bits using the binary event received and the corresponding probability estimate P(A).

In one embodiment, coding engine 415 codes an event that indicates a termination of arithmetic coded data. The event may be an end of slice flag or another indicator that non-arithmetic coded data is going to follow, if anything at all, in the bitstream.

In producing the zero or more information bits, coding engine 415 utilizes various registers including a range register 465, a low register 470, a bits outstanding register 475, and a counter register 480. The operation of encoder 400 in performing arithmetic coding is well known in the art.

In one embodiment, encoder 400 bounds a relationship of events to information bits, which is described elsewhere herein. Encoder 400 performs this operation, in part, by inserting stuffing bytes (or bits) into the information sequence, as is described herein.

Figure 5:
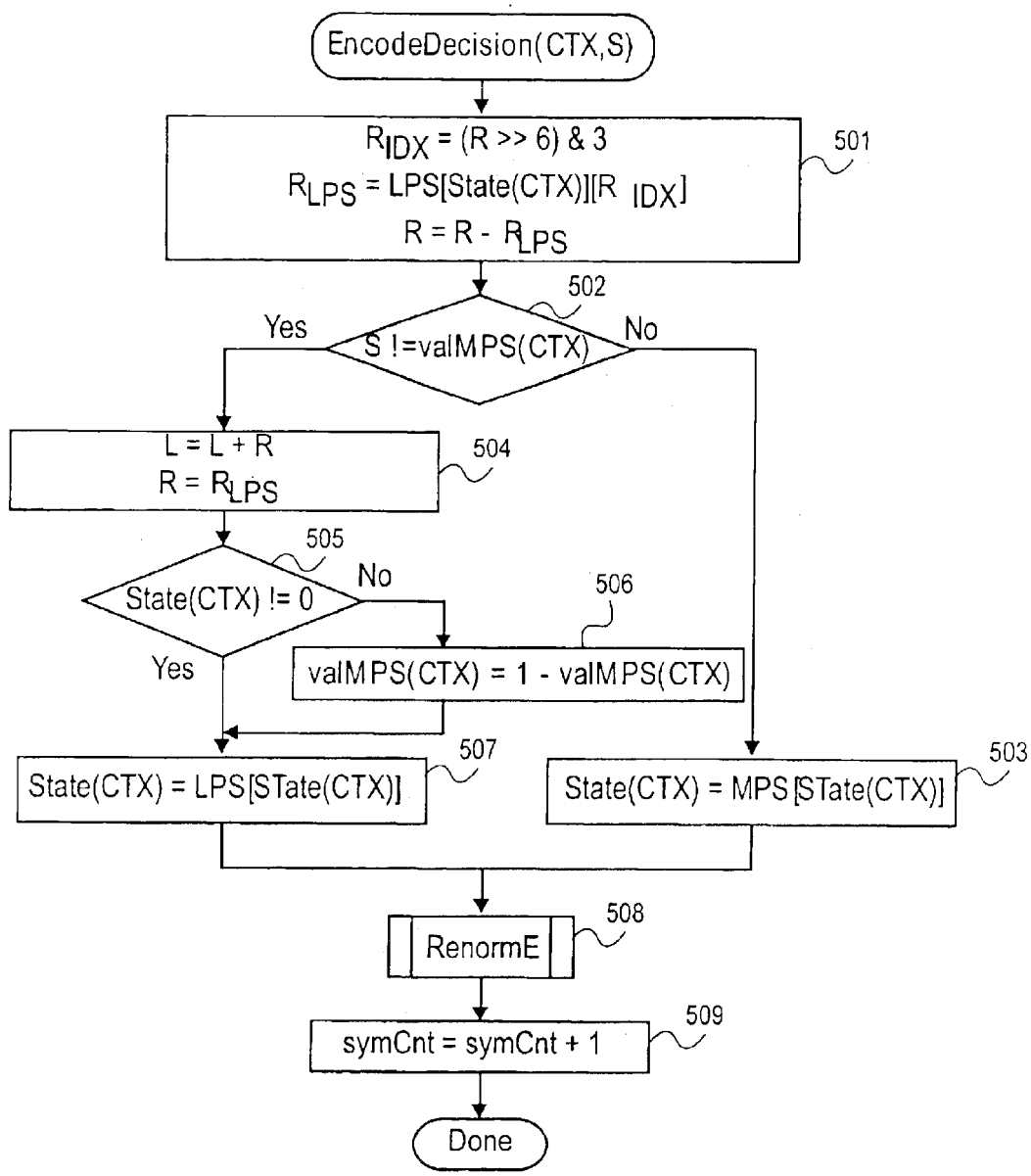
FIG. 5 is a flow diagram of one embodiment for encoding an event.

FIG. 5 is a flow diagram of one embodiment for encoding an event. The process is performed by processing logic, which may comprise hardware (e.g., circuitry, dedicated logic, etc.), software (such as is run on a general purpose computer system or a dedicated machine), or a combination of both. The inputs to the arithmetic encoding process are the binary events being decoded with the context ID identifying the context, and the value R, L, and symCnt, and written in the outputs are the bits that result from the encoding. In one embodiment, the encoding is symmetric with the decoding and, the state of the arithmetic encoding engine, as discussed above, is represented by the value of the value of L pointing to the lower end of the sub-interval and the value of the R specifying the corresponding range of the sub-interval.

In one embodiment, the encoding process is invoked only after the encoding engine is initialized. In one embodiment, initialization is performed by sending the value of L equal to zero and the value of R equal to 0x01FE, setting a first bit flag to one, bits outstanding (BO) value and symCnt (C) counters equal to zero. The first bit flag is used during encoding to indicate when the encoder is going through the put bit procedure for the first time. The symcnt counter stores a value indicating the number of events that are encoded.

Referring to FIG. 5, the process begins encoding a single event (e.g., bit) by deriving the value $R_{LPS}$ as follows (processing block 501). In one embodiment, processing logic derives the variable $R_{LPS}$ by setting the R index (or $R_{idx}$) equal to the value of R shifted six positions to the right and ANDed with the number 3 Hex. Then processing logic sets the $R_{LPS}$ value equal to a value determined by accessing a probability estimation station machine table, such as a table showing FIG. 16A using the $R_{idx}$ value and the value of the state for the current context associated with the context. The R value is then set to the current R value minus $R_{LPS}$.

After computing the sub range interval for the MPS count, processing logic tests whether the value of the binary event being encoded is not equal to the value of the MPS (processing block 502). If the value of the binary event is equal to the MPS, then processing logic takes the MPS path and transitions the processing block 503 where processing logic updates the state machine to the next state indicated in the state machine for the context using the table in FIG. 16B and processing transitions to processing block 508. If processing logic determines that the binary event being encoded is not equal to the value of the MPS, then processing logic takes the LPS path and transitions to processing block 504 where processing logic sets the value of L equal to the value of L plus the value of R and sets the value of R equal to the value of $R_{LPS}$.

Thereafter, processing logic determines whether the state for the particular context is not equal to zero (processing block 505). In one embodiment, state zero is a state corresponding to a 50/50 probability. Alternatively, state zero is a state corresponding to another probability such as, for example, something near a 50/50 probability. If the state for the context is not equal to zero, processing logic transitions to processing block 507. If the state for the context is equal to zero, processing logic switches the meaning of the MPS (processing block 506) and transitions processing to block 507, and processing logic updates the state number of the context to the next state using the table in FIG. 16B (processing block 507).

Figure 6:
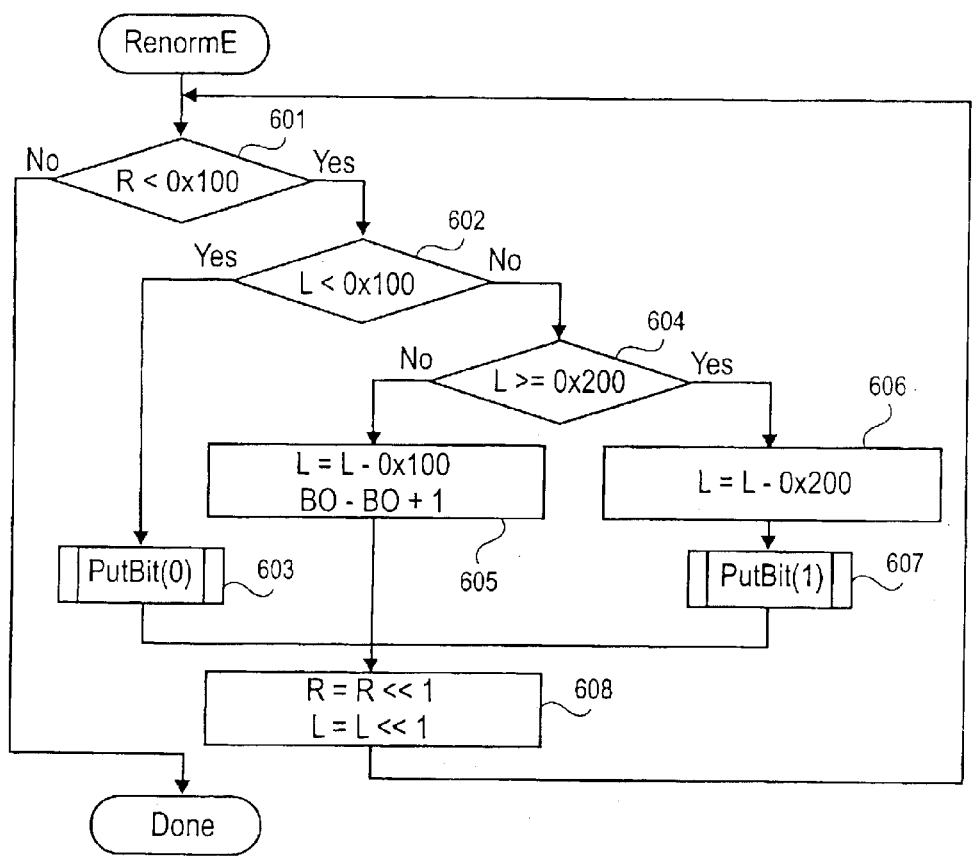
FIG. 6 is a flow diagram of one embodiment of an encoder renormalization procedure.

After performing processing block 507 and 503, processing transitions the processing block 508 where processing logic performs the renormalization procedure, such as renormalization in FIG. 6. Then processing logic increments the event counter value by 1 (processing block 509) and processing ends.

FIG. 6 is a flow diagram of one embodiment of an encoder renormalization procedure. The process is performed by processing logic, which may comprise hardware (e.g., circuitry, dedicated logic, etc.), software (such as is run on a general purpose computer system or a dedicated machine), or a combination of both.

Referring to FIG. 6, processing logic tests whether the value of R is less than 100 Hex (processing block 601). If not, the process is done. If it is, the process transitions to processing block 602 where processing logic tests whether the value of L is less than 100 Hex. If so, processing block transitions to processing block 603 where a put bit procedure is performed with parameter 0 and thereafter processing transitions to processing block 608. If processing logic determines that the value of L is greater than or equal to 100 Hex, processing logic tests whether the value of L is greater than 200 Hex. If not, processing logic sets the value of L to the result of subtracting 100 Hex from the value of L and increments the value of the bits outstanding (BO) by one with parameter 1 (processing block 605) and processing transitions to processing block 608. If the value of L is greater than or equal to 200 Hex, processing transitions to processing block 606 where processing logic sets the value of L to the result of subtracting 200 Hex from the value L performs the put bit procedure (processing block 607) and transitions to processing block 608.

Processing block 608, processing logic shifts the value of R to the left by one position and shifts the value of L by one position. Thereafter processing transitions the processing block 601 and the process is repeated.

Figure 7:
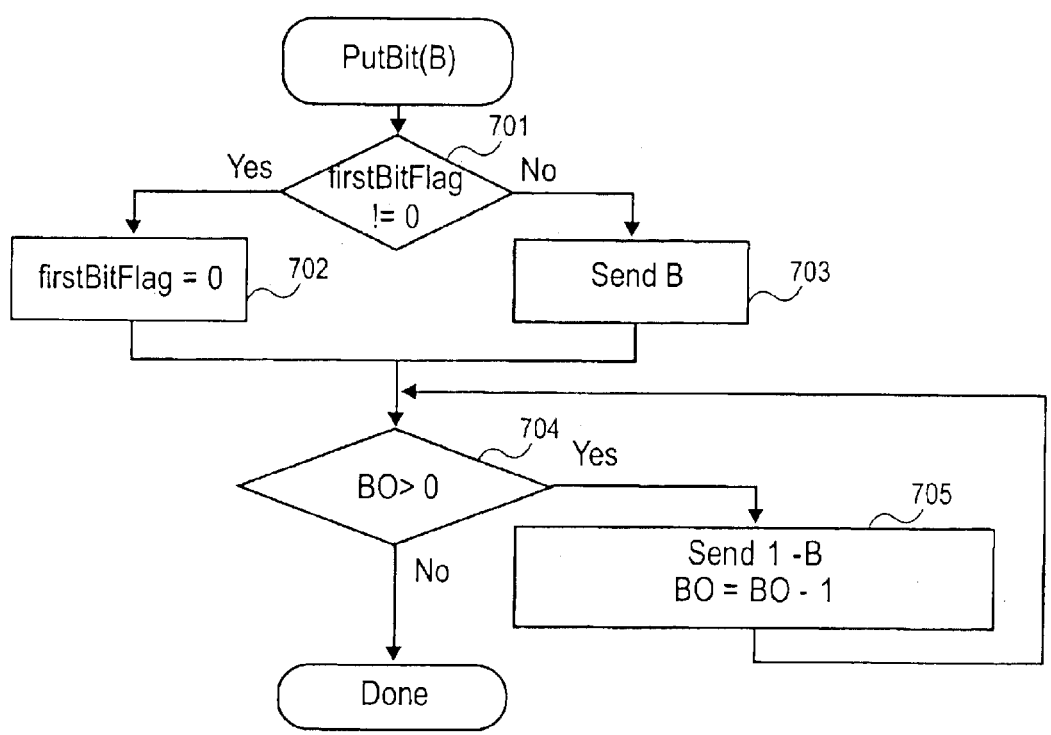
FIG. 7 illustrates one embodiment of the process for performing an embodiment of the put bit procedure.

FIG. 7 illustrates one embodiment of the process for performing an embodiment of the put bit procedure. The put bit procedure writes zero or more bits to the bitstream. The process is performed by processing logic, which may comprise hardware (e.g., circuitry, dedicated logic, etc.), software (such as is run on a general purpose computer system or a dedicated machine), or a combination of both.

Referring to FIG. 7, the processing logic initially checks whether the first bit flag is not equal to zero (processing block 701). If the first bit flag is set to 1, then processing logic sets the first bit flag equal to zero (processing block 702) and processing transitions to processing block 704. If not, processing logic sends a bit with value B (processing block 703) and processing logic transitions to processing block 704).

At processing block 704, processing logic tests whether the value of the bits outstanding (BO) is greater than zero. If not, the process ends. If so, processing logic sends a bit with value 1-B and decrements the value of BO by one (processing block 705). Thereafter the processing logic transitions to processing block 704.

Figure 8:
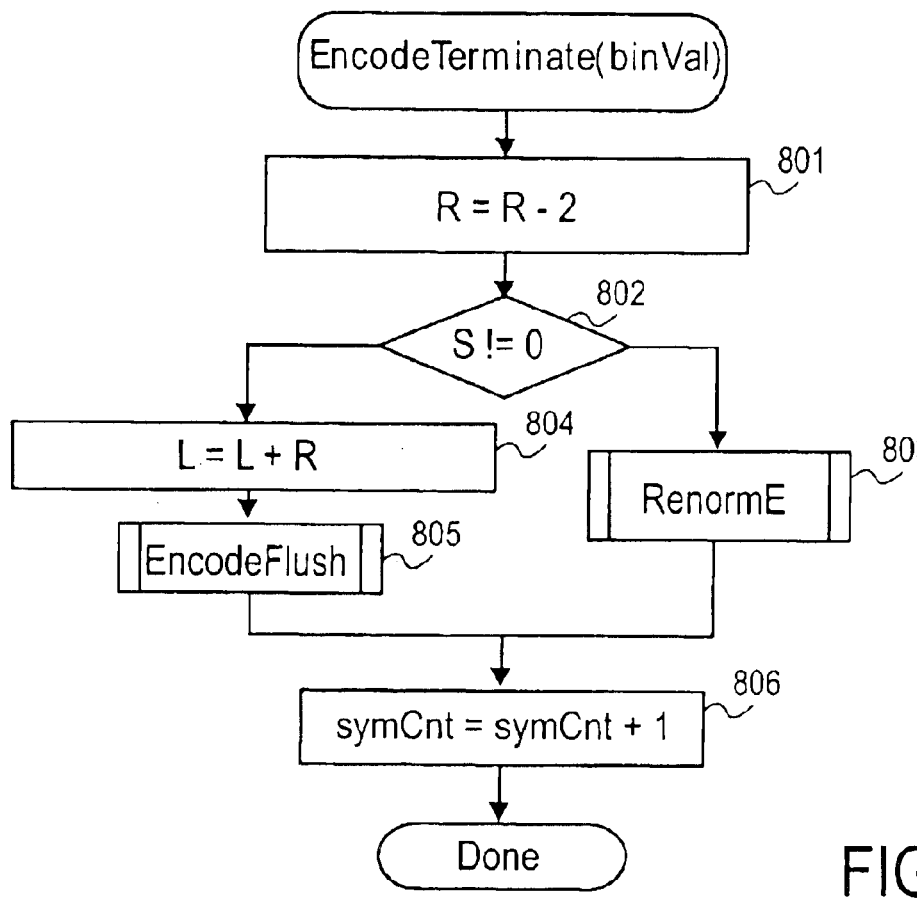
FIG. 8 is a flow diagram of one embodiment of a process for decoding an event before termination.

FIG. 8 is a flow diagram of one embodiment of a process for encoding an event before termination. This process may be utilized to encode the end of slice as well as any other binary event that signals the termination of the arithmetic coding. The process is performed by processing logic, which may comprise hardware (e.g., circuitry, dedicated logic, etc.), software (such as is run on a general purpose computer system or a dedicated machine), or a combination of both.

Referring to FIG. 8, processing logic initially decrements the value of R by 2 (processing block 801). Then processing logic tests whether the value of the binary event being encoded is not equal to zero (processing block 802). If the event is equal to zero, processing logic performs renormalization procedure such as one shown in FIG. 6 (processing block 803), and processing transitions to processing block 806. If the value of the binary event to be encoded is not equal to zero, then processing logic sets the value of L to the result of adding the value of L plus the value of R (processing block 804), performs an encoder flushing procedure (processing block 805), and transitions to processing block 806. At processing block 806, processing logic increments the event counter value by 1 and the encoding process ends.

As seen in the process above, in one embodiment, when the value of the binary event is equal to 1, arithmetic encoding is terminated and the flushing procedure is applied after encoding the event. When encoding such an event, the last bit written contains a stop bit equal to 1.

Figure 9:
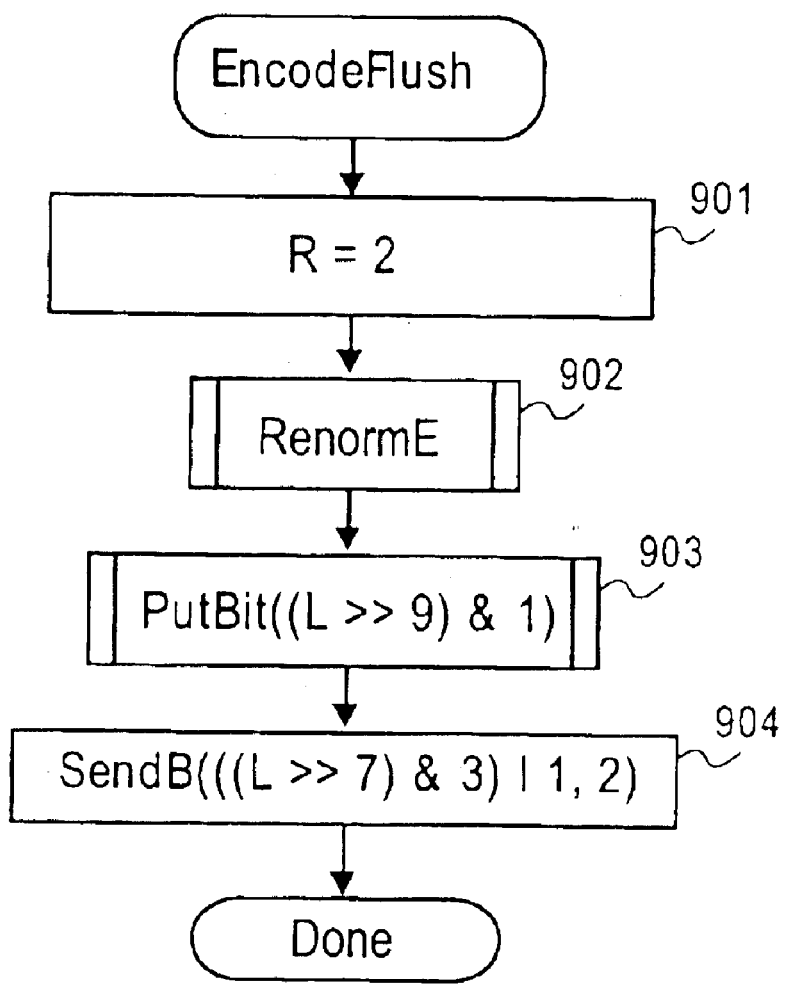
FIG. 9 illustrates a flow diagram of one embodiment of a process for flushing at termination.

FIG. 9 illustrates a flow diagram of one embodiment of a process for flushing at termination. The process is performed by processing logic, which may comprise hardware (e.g., circuitry, dedicated logic, etc.), software (such as is run on a general purpose computer system or a dedicated machine), or a combination of both.

Referring to FIG. 9, processing logic initially sets the value of R to 2 (processing block 901). Processing logic then performs a renormalization procedure such as renormalization procedure shown in FIG. 6 (processing block 902). Processing logic then performs the put bit procedure shown in FIG. 7 on a value equal to the value of L shifted to the right nine places and ANDed with the value of 1 Hex (processing block 903). The results of performing the ANDing operation on the shifted contents of the value of the L register cause the bit at the $10^{th}$ bit position (as counted from the recent significant bit) to be generated and subsequently output using the put bit procedure.

Finally, the processing logic sends two bits equal to the value of the L register shifted by seven places to the right, ANDed with a value of 3 Hex, and then ORed with 1 Hex (processing block 904). The ORing operation with 1 Hex is performed to add the stop bit.

Exemplary Decoder Operation

Figure 10:
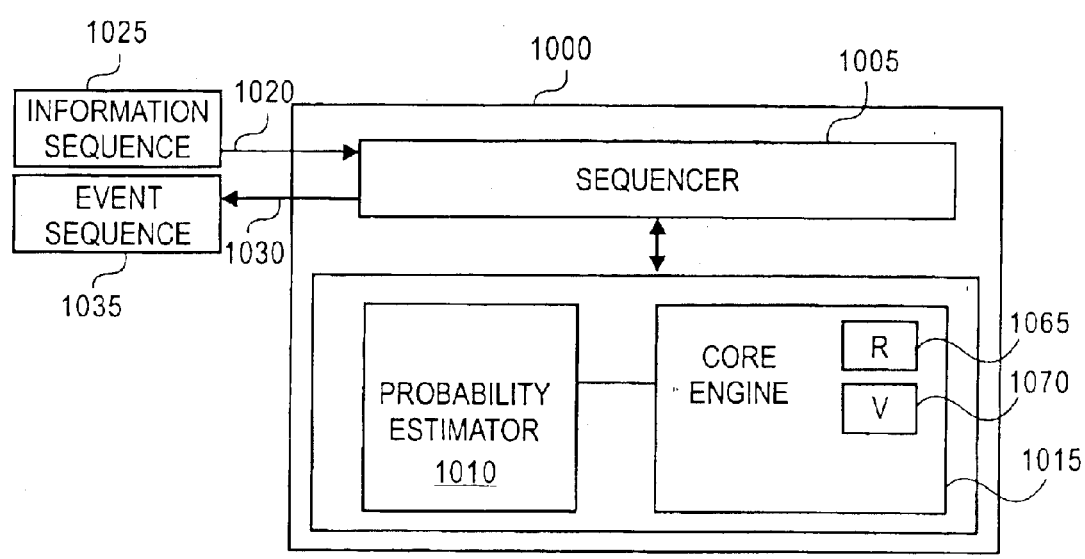
FIG. 10 is a block diagram of one embodiment an arithmetic decoder.

FIG. 10 is a block diagram of one embodiment an arithmetic decoder 1000. Referring to FIG. 10, decoder 1000 includes a sequencer 1005, a probability estimator 1010, and a decoding engine 1015 coupled together. An input 1020 provides a port for an information sequence 1025 (e.g., an ordered sequence of binary bits) to decoder 1000. The binary bits of the sequence 1025 may have a value of "0" or "1." In one embodiment, decoder 1000 processes the information sequence to generate an event sequence 1035. The generated sequence of events is an ordered event sequence comprising multiple events (e.g., binary events), which may have values other than single bit values. The event sequence is provided to output 1030, which includes at least one output port from decoder 1000.

Upon receiving information sequence 1025, sequencer 1005 transmits the one or more bits to decoding engine 1015. Decoder 1000 iteratively generates the one or more events of the event sequence as follows. For each event, sequencer 1005 transmits a corresponding context to probability estimator 1010.

Based on the value of the received context, probability estimator 1010 generates a corresponding probability estimate P(A), which is sent to decoding engine 1015, and used by decoding engine 1015 in generating the event. In one embodiment, probability estimator 1010 sends multiple probability estimates to decoding engine 1015 and decoding engine 1015 selects one of the probability estimates based on the R value. Alternatively, the R value may be sent to probability estimator 1010, which uses it to select one probability estimate to be sent. Probability estimator 1010 then updates its internal state based on the value of the binary event received from decoding engine 1015.

Decoding engine 1015 sends each generated binary event to the probability estimator 1010 and to the sequencer 1005. Decoding engine 1015 consumes zero or more information bits for each binary event generated. Sequencer 1005 may thus transmit zero or more bits from the information sequence to the decoding engine 1015 after the generation of an event. Decoding engine 1015 utilizes various registers in generating the events of event sequence 1035, including a range register 1065, a value register 1070. Operation of the decoder 1000 is shown in the flow diagram discussed below.

The following flow diagrams depict decoding operations performed on a slice by one embodiment of a decoder, such as decoder 1000. In one embodiment, the decoder performs decoding according to the flow diagrams depicted in FIGS. 12, 14A, 14B, 15A or 15B based on the value of a context. The illustrated processes may be incorporated in other processes, modified or otherwise adapted to obtain the benefits of the improvements embodied therein. In one embodiment, the decoder reads a byte at a time. In an alternative embodiment, the decoder reads a bit at a time.

Figure 11:
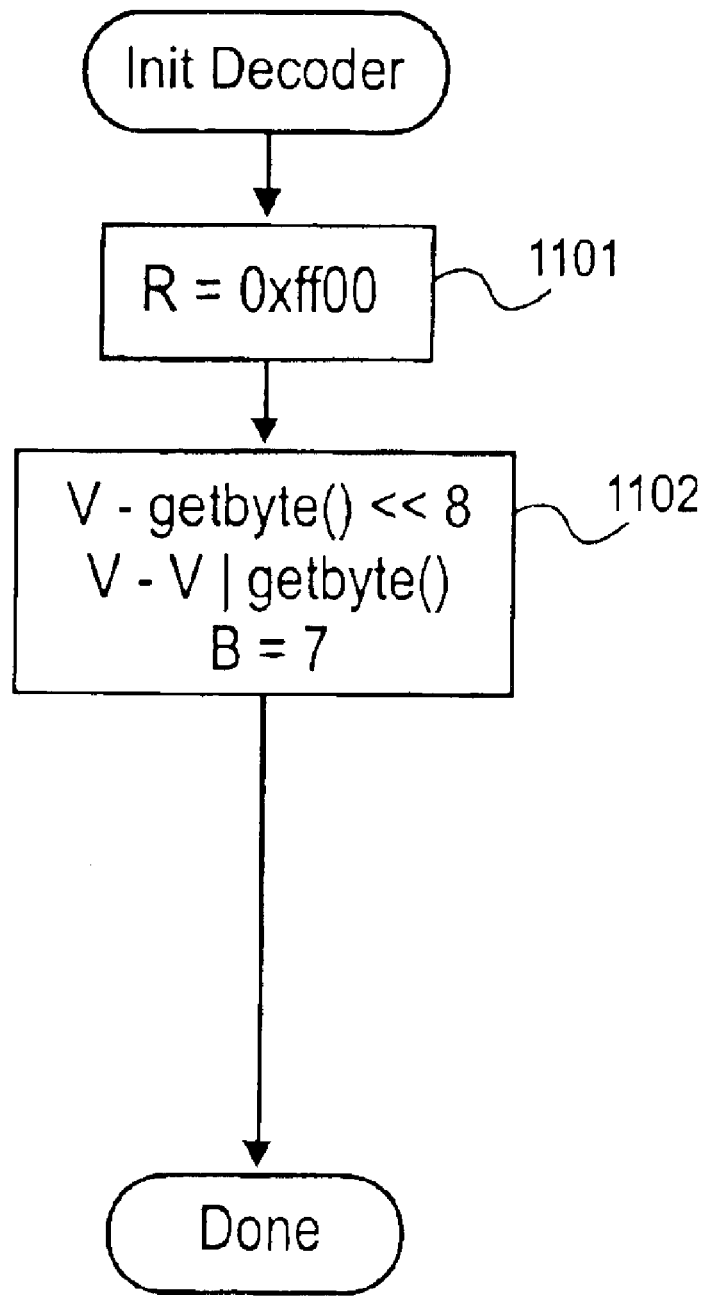
FIG. 11 is a flow diagram of one embodiment of an arithmetic decoder initialization process.

FIG. 11 is a flow diagram of one embodiment of an arithmetic decoder initialization process. The process is performed by processing logic that may comprise hardware (e.g., circuitry, dedicated logic, etc.), software (such as is run on a general purpose computer system or a dedicated machine), or a combination of both.

Referring to FIG. 11, the process begins with processing logic setting the range R to a predetermined number (processing block 1101). In one embodiment, the predetermined number is 0xff00. After initializing the range R, processing logic reads two bytes of compressed data into register V (processing block 1102). In one embodiment, register V stores the compressed bits one byte at a time. Register V may be implemented to store the compressed data one bit at a time, but the constants used in the process described herein would have to be changed accordingly.

More specifically as shown, processing logic reads in one byte and shifts it 8 places to the left and then gets another byte and adds it into register V with an arithmetic OR operation. Once the compressed data has been read into register V, processing logic sets the value of register B to a predetermined value. Register B indicates the number of extra bits in register V that are available for processing. When the value in register B becomes less than 0, then another byte of compressed data needs to be fetched. In one embodiment, the predetermined value is 7.

Figure 12:
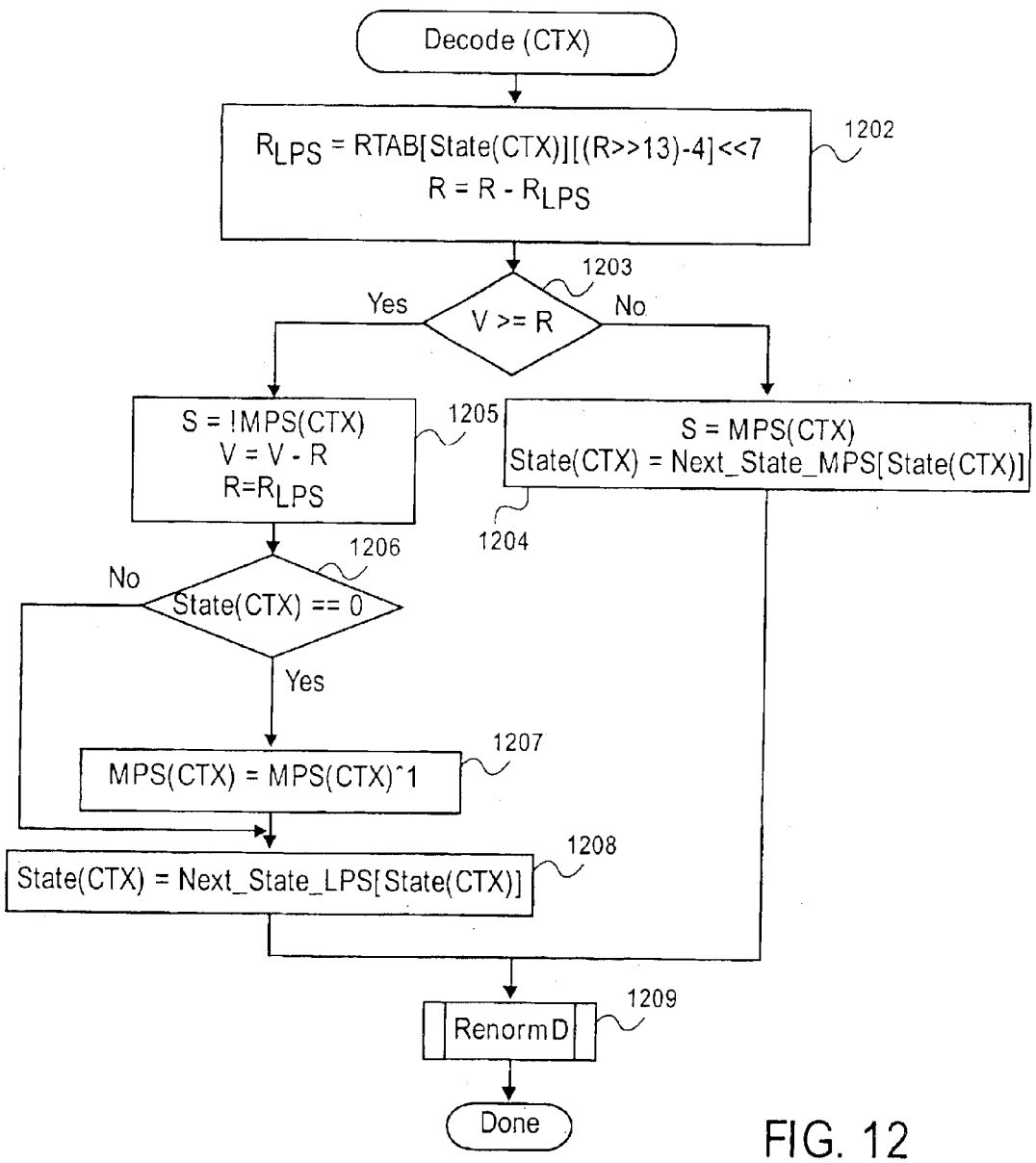
FIG. 12 is a flow diagram of one embodiment of a process to decode a binary event.

FIG. 12 is a flow diagram of one embodiment of a process to decode a binary event. The process is performed by processing logic that may comprise hardware (e.g., circuitry, dedicated logic, etc.), software (such as is run on a general purpose computer system or a dedicated machine), or a combination of both.

Referring to FIG. 12, the process begins by computing the size of the interval for the LPS (processing block 1202). In one embodiment, this computation is performed by a multiplication. The multiplication may be approximated by using a table look-up that is based on the state associated with the context (CTX). In one embodiment, a finite state machine is used to indicate what the probability is depending on the state of the machine. Then for the lookup, the value of the state and the next two most significant bits of R after the most significant bit of R. An exemplary table to perform the lookup is shown in FIG. 16A. An exemplary method for generating the table is also given below.

The result of the table look up is shifted by 7 because this implementation reads bytes at a time instead of bits. The shifted result of the table lookup is the sub-range interval of the LPS referred to as $R_{LPS}$.

Also as part of processing block 1202, processing logic computes the sub-interval range for the MPS by subtracting the sub-range interval of the LPS $R_{LPS}$ from the value of register R. The processing logic sets the value of R equal to the result of the subtraction.

After computing the sub-range interval for the MPS, processing logic tests whether the value of register V is greater than or equal to the sub-interval of the MPS stored in register R, indicating that the current bit being processed is in the LPS sub-range (processing block 1203). If not, then processing logic takes the MPS path and transitions to processing block 1204 where processing logic sets the value being decoded (i.e., the result being returned) S equal to the value that is defined to be the MPS for that particular context and updates the state machine for the context to the next state indicated in the state machine for the context using the table in FIG. 16B. In one embodiment, for an MPS, the state machine update comprises incrementing the state in the state table by one.

If processing logic determines that the value V is greater than or equal to the value in register R, then processing logic takes the LPS path and transitions to processing block 1205 where the result S is set equal to the LPS (not MPS) for the particular context CTX, the value V is set equal to the result of subtracting the value of range R from the current value of V, and the range R is set equal to the range for the LPS, namely $R_{LPS}$ (processing block 1205).

Processing logic also checks whether the state for the context of the binary event is zero (processing block 1206). In one embodiment, state 0 is the state corresponding to a 50/50 probability. Alternatively, state zero is a state corresponding to another probability such as, for example, something near a 50/50 probability. If it isn't, then processing transitions to processing block 1208. If it is, processing logic switches the meaning of the MPS (processing block 1207).

Thereafter, the state number of the context is updated to the next state using the table in FIG. 16B (processing block 1208) and processing logic performs a renormalization procedure (processing block 1209), which is discussed in more detail below.

Figure 13:
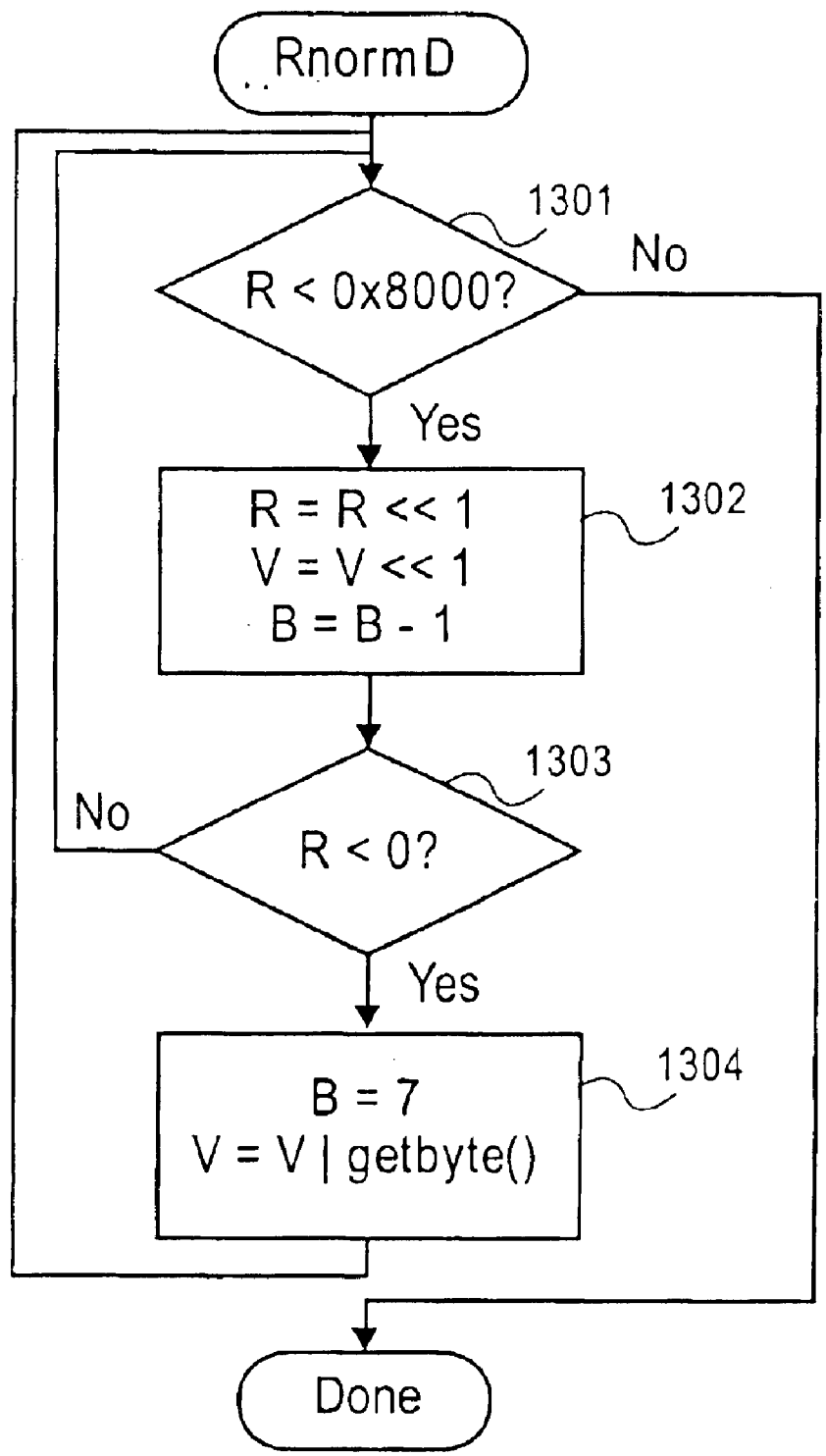
FIG. 13 is a flow diagram of a renormalization procedure.

FIG. 13 is a flow diagram of a renormalization procedure. The process is performed by processing logic that may comprise hardware (e.g., circuitry, dedicated logic, etc.), software (such as is run on a general purpose computer system or a dedicated machine), or a combination of both.

Referring to FIG. 13, the process begins by processing logic testing whether R is less than 8000 Hex (processing block 1301). If R is greater than or equal to 8000 Hex, the renormalization process ends. If not, processing logic doubles the values of R and V (processing block 1302). In one embodiment, processing logic doubles the values of R and V by shifting the bits of R and V one position to the left. The value of B is also decremented by 1 since the shifting has caused one less bit to be available for processing. Processing logic then checks whether the value of B is less than 0 (processing block 1303). If not, then processing transitions to processing block 1301 and the process is repeated. If the value of B is less than 0, then processing transitions to processing block 1304 where the value of B is set to 7 and the another byte to be processed is fetched and logically ORed with the current contents of register V. Thereafter, processing transitions to processing block 1301 and the process is repeated.

Figure 14B:
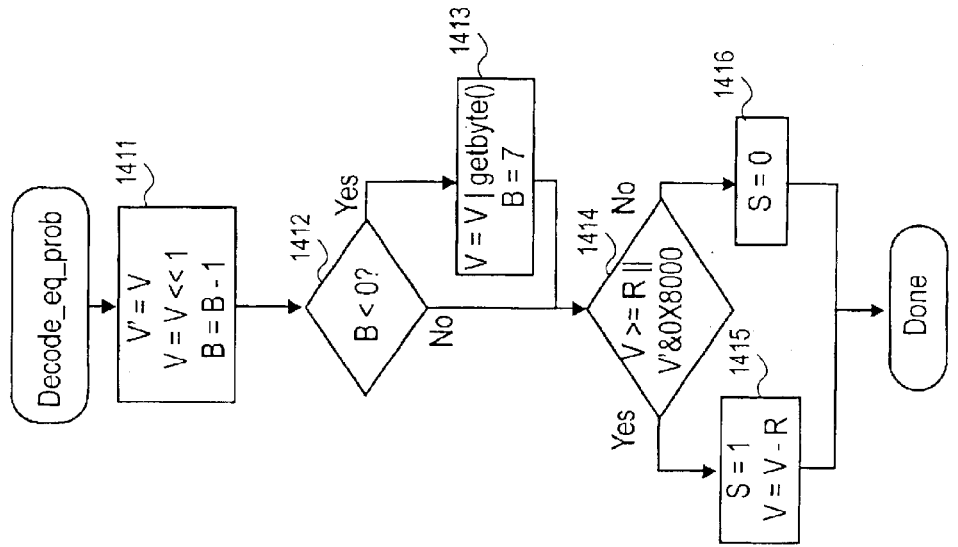
FIGS. 14A and 14B illustrate flow diagrams for decoding a binary event with equi-probability.
Figure 14A:
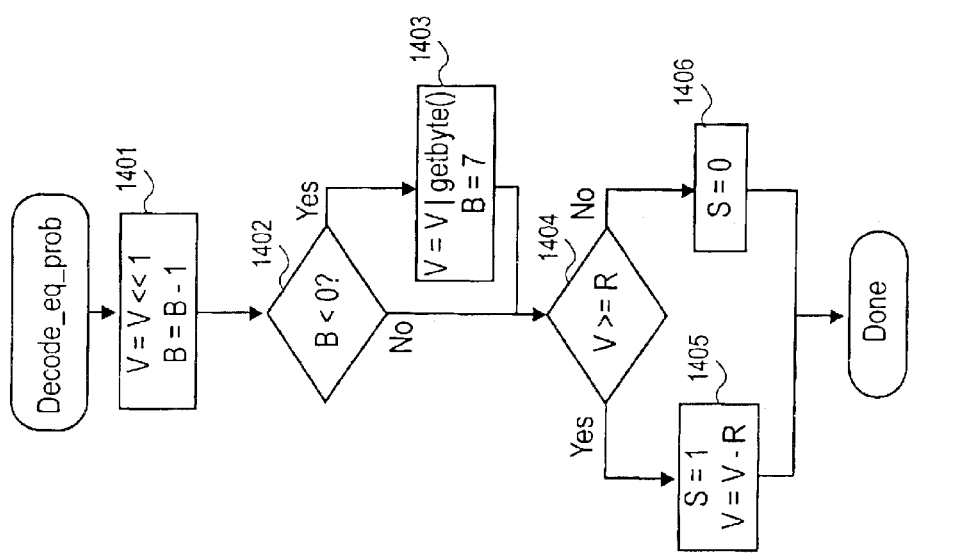

FIGS. 14A and 14B illustrate flow diagrams for decoding an event with equi-probability. FIG. 14A may be used when the size of register V is greater than 16 bits, while FIG. 14B may be used when the size of register V is 16 bits. These implementations may be used when fetching a byte at a time.

The processes are performed by processing logic that may comprise hardware (e.g., circuitry, dedicated logic, etc.), software (such as is run on a general purpose computer system or a dedicated machine), or a combination of both.

Where distributions are centered around zero and the likelihood of getting a positive value or a negative value is roughly the same, these processes may be used. For example, they may be used when processing a sign value of coefficients. Instead of estimating the likelihood of it being positive or negative, fixed estimates are used recognizing that the probability is 50/50. Thus, there is not need to perform a table lookup for multiplication of R with a probability. Note that these do not affect termination.

Referring to FIG. 14A, the process begins by processing logic doubling the value of V and decrementing the value of B by 1 (processing logic 1401). The doubling of the value of V may be performed by shifting the bits of V one position to the left.

Next, processing logic checks whether the value of B is less than 0 (processing block 1402). If not, then processing transitions to processing block 1404. If the value of B is less than 0, then processing transitions to processing block 1403 where the value of B is set to 7 and the another byte to be processed is fetched and logically ORed with the current contents of register V.

At processing block 1404, processing logic tests whether the value of V is greater than or equal to the value of R. If so, processing logic sets the result S to 1 and sets the value of V to the result of subtracting the value R from the value V (processing block 1405), and the process end. If not, processing logic sets the result S to 0 (processing block 1406) and the process ends.

Referring to FIG. 14B, the process begins by processing logic setting the value V' equal to V, doubling the value of V, and decrementing the value of B by 1 (processing logic 1411). The doubling of the value of V may be performed by shifting the bits of V one position to the left.

Next, processing logic checks whether the value of B is less than 0 (processing block 1412). If not, then processing transitions to processing block 1414. If the value of B is less than 0, then processing transitions to processing block 1413 where the value of B is set to 7 and the another byte to be processed is fetched and logically ORed with the current contents of register V.

At processing block 1414, processing logic tests whether the value of V is greater than or equal to the value of R or V' is greater than or equal to 8000 Hex. If so, processing logic sets the result S to 1 and sets the value of V to the result of subtracting the value R from the value V (processing block 915), and the process end. If not, processing logic sets the result S to 0 (processing block 916) and the process ends.

Figure 15A:
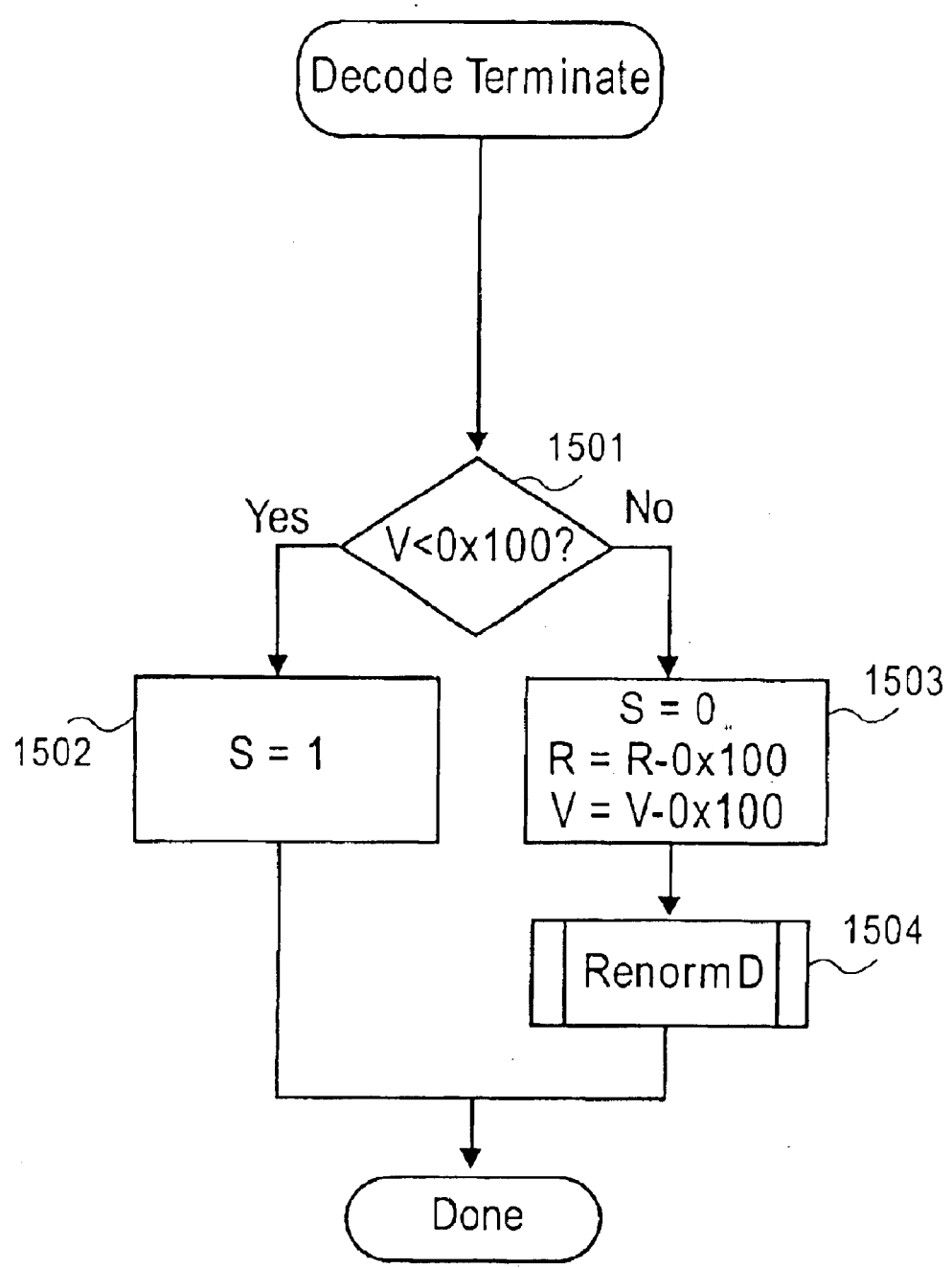
FIGS. 15A and 15B are flow diagrams of embodiments for decoding an end of slice flag or other binary events before termination.

FIG. 15A is a flow diagram of one embodiment for decoding encoded events that indicate the termination of arithmetic coding. Such an event may comprise an end of slice flag. With respect to the end of slice flag, syntax may be used to indicate to a decoder the presence of an end of slice flag. In one embodiment, this process is performed for every macro block; however, only for the last macro block in the slice is the result going to indicate an end of a slice (e.g., output a result that is 1).

An event to signal termination of arithmetic coding (for a decoder) may be used when data is going to follow the arithmetic coding in the bitstream that is uncompressed or compressed within another encoding technique other than arithmetic coding. Note that additional arithmetic coded data may follow this uncompressed data or data compressed with a non-arithmetic coding technique. Thus, the event to signal termination may be used in cases where non-arithmetic coded data is interleaved in a bitstream with arithmetic coded data.

The process is performed by processing logic that may comprise hardware (e.g., circuitry, dedicated logic, etc.), software (such as is run on a general purpose computer system or a dedicated machine), or a combination of both.

Referring to FIG. 15A, processing logic tests whether the value of V is less than 100 Hex (processing block 1501), thereby indicating that the last macro block in the slice has been reached. If so, processing logic sets the result S, representing the decoded symbol, to 1 (processing block 1502) and the decoding process for the slice ends. If not, processing logic sets the output result S to 0, sets the value of R to the result of subtracting 100 Hex from the value of R, and sets the value of V to the result of subtracting 100 Hex from the value of V (processing logic 1503). Then processing logic performs the renormalization procedure of FIG. 3 (processing block 1504) and the process ends.

Figure 15B:
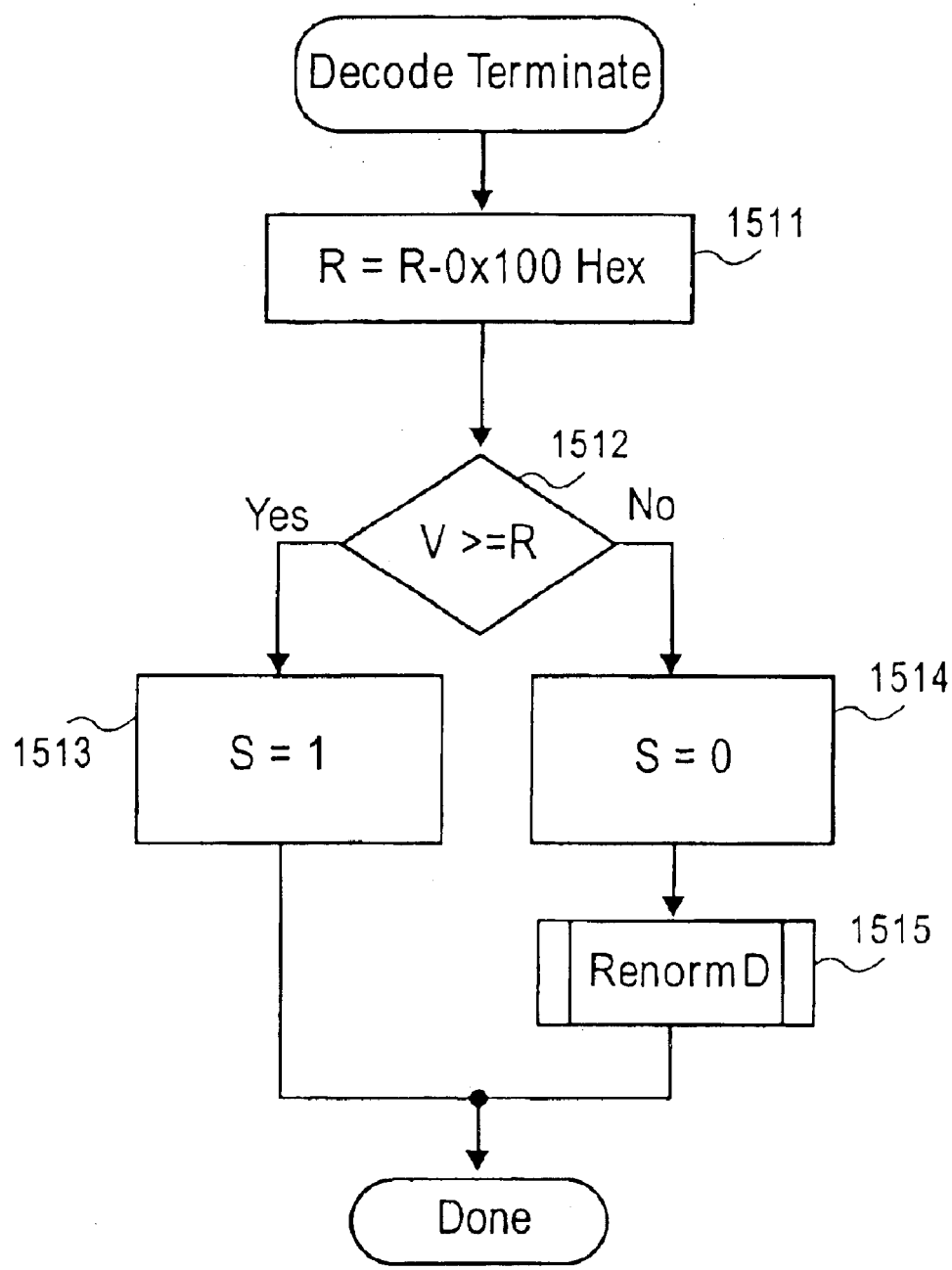

Note that in one embodiment, the convention between MPS and LPS may be switched. FIG. 15B is a flow diagram of one embodiment of a process for encoding an event before termination when a convention between the MPS and the LPS is switched. The process may be performed by processing logic, which may comprise hardware (e.g., circuitry, dedicated logic, etc.), software (such as is run on a general purpose computer system or a dedicated machine), or a combination of both.

Referring to FIG. 15B, processing logic begins by subtracting 100 Hex from the value of R (processing block 1511). Processing logic then tests whether the value of V is greater than or equal to the value of R (processing block 1512). If so, processing logic sets the output result S, representing the decoded symbol to one (processing block 1513) and the decoding process for decoding the event before termination ends. Thus, no renormalization is performed. If not, processing logic sets the output result S to zero (processing block 1514) and performs the renormalization procedure of FIG. 13 (processing block 1515) and the process ends.

Construction of State Machine for Probability Estimation

An exemplary process to construct the state machine in FIGS. 16A and 16B is given in C code below.

```
C-code:
#define N 64
#define Pmax 0.5
#define Pmin 0.01875
#define regsize 9
#define ONE (1<<regsize)
    double alpha;
    double sum;
    int i,j;
    double q;
    float prob64[N];
    int next_state_MPS_64[N];
    int next_state_LPS_64[N];
    int switch_MPS_64[N];
    int qLPS[N][4];
    alpha = pow(Pmin/Pmax,1.0/(N-1));
    sum = 0.5;
    for (i=0; i<N; i++) {
        prob64[i] = Pmax*pow(alpha,i);
        next_state_MPS_64[i] = (i==N-1)?N-1:i+1;
        q = prob64[i]*alpha+(1-alpha);
        q = q/prob64[i];
        q = -log(q)/log(alpha);
        sum += q;
        k = (int)(sum);
        sum -= k;
        next_state_LPS_64[i] = (i-k<0)?0:i-k;
        for (j=0; j<4; j++) {
            RTAB[i][j] = (int)(ONE/8*prob64[i]/log((j+5.0)/
                (j+4.0))+0.5);
            if (j == 0 && RTAB[i][j] > ONE/4)
                RTAB[i][j] = ONE/4;
        }
    }
```

In the code above, N defines the number of states in a state machine. In one embodiment, the state machine is symmetric and the total number of states is 2*N (128 in this example). A state may be represented by two variables: state (a number between 0 and N−1, inclusive) and a MPS flag (determines whether 0 or 1 is the MPS).

In one embodiment, the states are organized such that higher state numbers correspond to lower probabilities for the LPS. The state machine is defined such as to approximate the following procedure:

(a) p(LPS)<—p(LPS)* alpha, if an MPS is observed
(b) p(LPS)<—p(LPS)* alpha+(1-alpha), otherwise
where alpha defines an adaptation rate. Alpha is typically in the range of 0.9 to 1, but may extend into or be in other ranges based on the desired adaptation.

In the code above, alpha is set equal to pow(0.01875/0.5, 1.0/63) where 0.01875 (Pmin) defines the probability of an LPS for state N−1, 0.5 (Pmax) defines the probability of an LPS for state 0, and 1.0/63 is 1 over N−1. Note that pow(a,b) is the number a to the power b.

The array named prob64 contains floating-point values representing probabilities of an LPS associated with each state. Prob64[i] is set to Pmax*pow(alpha,i). Prob64[0] is equal to Pmax and Prob64[N−1] is equal to Pmin.

Next_state_MPS_64[i] defines the state transition upon observation of an MPS. If i is different from N−1, the state is increased by 1. Otherwise, the state remains unchanged. Given the combination of Prob64[i] and Next_state_MPS_64[i], part (a) of the update procedure defined above is well approximated.

To approximate part (b) of the update procedure, Next_state_LPS_64[i] should be set to i−(−log((prob64[i]*alpha+(1−alpha))/prob64[i])/log(alpha)). This value, however, is not an integer number and an integer approximation should be sought. In one embodiment, the value is rounded to the nearest integer. However, in an alternative embodiment, to better balance between rounding up and rounding down, a variable sum is used such that on average the difference introduced by rounding is close to zero.

The value of RTAB[i][j] is computed such as to approximate R*prob64[i]. The variable j is determined by the interval in which R lies. The variable j is set equal to 0 for R in [256,319], 1 for [320,383], 2 for [384,447], and 3 for [448,511], where, for example, (ONE*4)/8 equals 256, (ONE*5)/8−1 equals 319, etc. The calculation of (ONE/8)/log(j+5)/(j+4)) represents the expected value of R given j.

To enable faster implementations, it is desirable to guarantee that on coding an MPS, at most one iteration of renormalization occurs. To this end, RTAB[i][0] is clipped to ONE/4. Therefore R cannot be smaller than ONE/4 before renormalization. More generally, in one embodiment, RTAB[i][j] is clipped to (ONE/4)+(ONE/8)*j but this case does not occur for j different from 0 in the present example.

Thus, using the technique described above, the state table of FIGS. 16A and 16B may be generated, with the exception of one state in one embodiment. In FIG. 16A, state 63 includes R values of 2, 2, 2, 2. In FIG. 16B, once in state 63, the next state is state 63. Thus, regardless of whether an LPS occurs or an MPS occurs, the state does not change. Also in FIG. 16B, once in state 62, state stays in state 62 upon the occurrence of an MPS.

Exemplary Embodiments in Source Code

Sample encoders and a sample decoder in C code are given below. These methods may be implemented using any suitable processing device for coding and decoding the data (e.g., video data). In some embodiments, the process may be performed by a combination of hardware and software elements. Other adaptations may be made. Functions for encoding and decoding are described below in C form.

Encoder:
```
void start_encode( ) {
    encode_slice_header( );
    while (!byte_aligned)
        send_bit(0);
    R = 0x1fe;
    L = 0;
    BO = 0;
    FB = 1;
}
void finish_encode( ) {
    R = 2;
    renorm_encode( );
    bit_plus_follow( (L >> 9) & 1);
    send_bit( (L >> 8) & 1);
    send_bit(1); // stop_bit
    while (!byte_aligned( ))
        send_bit(0); // alignment_bit
}
```

```
void bit_plus_follow(int b) {
    if (FB == 1)
        FB = 0;
    else
        send_bit(b);
    while (BO > 0) {
        BO--;
        send_bit(!b);
    }
}
void encode_renorm( ) {
    while ( ! (R&0x100) ) {
        if (L+R < 0x200)
            bit_plus_follow(0);
        else if (L >= 0x200) {
            bit_plus_follow(1);
            L -= 0x200;
        }
        else {
            BO++;
            L -= 0x100;
        }
        R <<= 1;
        L <<= 1;
    }
}
void encode_event(int ctx, int b) {
    rLPS = table[state[ctx] ][ (R>>6)-4];
    R -= rLPS;
    if (b == MPS[state[ctx] ] )
        state[ctx] = next_state_MPS[state[ctx] ];
    else {
        L += R;
        R = rLPS;
        if (state[ctx] == 0)
            MPS[state[ctx] ] = !MPS[state[ctx] ];
        state[ctx] = next_state_LPS[state[ctx] ];
    }
    encode_renorm( );
}
void encode_equiprob_event(int b) {
    L <<= 1;
    if (b)
        L += R;
    if (L+R < 0x400)
        bit_plus_follow(0);
    else if (L >= 0x400) {
        bit_plus_follow(1);
        L -= 0x400;
    }
    else {
        BO++;
        L -= 0x200;
    }
}
void encode_end_of_slice_flag(int b) {
    if (b == 0) {
        R-=2;
        L+=2;
        encode_renorm( );
    }
}
```
Decoder (byte based):
```
void start_decode( ) {
    decode_slice_header( );
    while (!byte_aligned( ))
        get_bit( );
    R = 0xff80;
    V = get_byte( ) << 8;
    V |= get_byte( );
    B = 7;
}
void finish_decode( ) {
    while (more_bytes_in_slice( ))
        get_byte( ); // stuffing byte
}
void decode_renorm( ) {
    while (R<0x8000) {
```

```
            R <<= 1;
            V <<= 1;
            B--;
            if (B<0) {
                B = 7;
                V |= get_byte( );
            }
        }
    }
    int decode_equiprob( ) {
        V = (V<<1);
        B--;
        if (B<0) {
            V |= get_byte( );
            B = 7;
        }
        if (V >= R) {
            V -= R;
            bit = 1;
        }
        else
            bit = 0;
        return bit;
    }
    int decode_event(int ctx) {
        rLPS = table[state[ctx]] [ (R>>13)-4]<<7;
        R -= rLPS;
        if (V < R) {
            state[ctx] = next_state_MPS[state[ctx]] ;
            bit = MPS[state[ctx]] ;
        }
        else {
            bit = !MPS[state[ctx]] ;
            V -= R;
            R = rLPS;
            if (state[ctx] == 0)
                MPS[state[ctx]] = !MPS[state[ctx]] ;
            state[ctx] = next_state_LPS[state[ctx]] ;
        }
        decode_renorm( ) ;
        return bit;
    }
    int decode_end_of_slice_flag( ) {
        if (V < 0x100)
            bit = 1;
        else {
            bit = 0;
            R-=0x100;
            V-=0x100;
            decode_renorm( ) ;
        }
        return bit;
    }
    Alternative byte-based end of slice decoding for use when the
    MPS/LPS convention is switched
    int decode_end_of_slice_flag( ) {
        R -= 0x100;
        if (V >= R)
            bit = 1;
        else {
            bit = 0
            decode_renorm( ) ;
        }
        return bit;
    }
    Decoder (bit based) :

void start_decode( ) {
        decode_slice_header( ) ;
        while (!byte_aligned( ))
            get_bit( ) ;
        R = 0x1fe;
        V = 0;
        for (i=0; i<9; i++)
            V = (V<<1) | get_bit( ) ;
    }
    void finish_decode( ) {
        while (!byte_aligned( ))
            get_bit( ) ; //alignement bit
```

```
        while (more_bytes_in _slice( ) )
            get_byte( ) ; //stuffing byte
    }
    int decode_renorm( ) {
        while (R<0x100) {
            R <<= 1;
            V = (V<<1) |get_bit( ) ;
        }
    }
    int decode_equiprob( ) {
        V = (V<<1) | get_bit( ) ;
        if (V >= R) {
            V -= R;
            bit = 1;
        }
        else
            bit = 0;
        return bit;
    }
    int decode_event(int ctx) {
        rLPS = table[state[ctx]] [ (R>>6)-4] ;
        R -= rLPS;
        if (V < R) {
            state[ctx] = next_state_MPS[state[ctx]] ;
            bit = MPS[state[ctx]] ;
        }
        else {
            bit = !MPS[state[ctx]] ;
            V -= R; R = rLPS;
            if (state[ctx] == 0)
                MPS[state[ctx]] = !MPS[state[ctx]] ;
            state[ctx] = next_state_LPS[state[ctx]] ;
        }
        decode_renorm( ) ;
        return bit;
    }
    int decode_end_of_slice_flag( ) {
        if (V < 2)
            bit = 1;
        else {
            bit = 0;
            R-=2;
            V-=2;
            decode_renorm( ) ;
        }
        return bit;
    }
    Alternative bit-based end_of_slice flag decoding for use when the
    MPS/LPT convention is switched
        int decode_end_of_slice_flag( ) {
            R -= 2;
            if (V >= R)
                bit = 1
            else {
                bit = 0;
                decode_renorm( ) ;
            }
            return bit;
        }
```

Note that in the arithmetic coder described above, there is an interval that is split into two, a top interval and a bottom interval. One of the intervals represents an MPS and the other interval represents the LPS. In one embodiment, assigning the MPS and LPS to intervals comprises assigning a 1 to one interval and a 0 to the other. In the source code above, when the interval is split for coding end_of_slice_flag, the MPS (value 0) is assigned the upper sub-interval. It is also possible to assign the MPS to the lower sub-interval.

The following code illustrates another exemplary encoder. Note that in the code, S is the minimum number of bytes in the slice to satisfy the bounding relationship described above.

```
void start_encode( ) {
    send_NAL_first_byte( ) ;
    encode_slice_header( ) ;
    while (!byte_aligned( ) )
        send_bit(0) ;
    R = 0x1fe; // range
    L = 0; // low
    BO = 0; // bits outstanding
    C = 0; // event counter
    FB = 1; // first bit flag
}
void finish_encode( ) {
    bit_plus_follow((L >> 9) & 1) ;
    for (i=8; i>=1; i--)
        send_bit( (L >> i) & 1) ;
    send_bit(1) ; // stop_bit
    while (!byte_aligned( ) )
        send_bit(0) ; // alignment_bit
    RBSP_to_EBSP( ) ;
    S = min_bytes(C, number_of_macroblocks_in_slice) ;
    while (S > bytes_in_NAL_unit( ) )
        send_three_bytes(0x000003) ; // write bytes directly into NAL
        unit
}
void bit_plus_follow(int b) {
    if (FB == 1)
        FB = 0;
    else
        send_bit(b) ;
    while (BO > 0) {
        BO--;
        send_bit(!b) ;
    }
}
void encode_renorm( ) {
    while ( ! (R&0x100) {
        if (L+R < 0x200)
            bit_plus_follow(0) ;
        else if (L >=0x200) {
            bit_plus_follow(1) ;
            L -= 0x200;
        }
        else {
            BO++;
            L -= 0x100;
        }
        R <<= 1;
        L <<= 1;
    }
}
void encode_event(int ctx, int b) {
    rLPS = table[state[ctx] ] [ (R>>6)-4] ;
    R -= rLPS;
    if (b == MPS[state[ctx] ] )
        state[ctx] = next_state_MPS[state[ctx] ] ;
    else {
        L += R;
        R = rLPS;
        if (state[ctx] == 0)
            MPS[state[ctx] ] = !MPS[state[ctx] ] ;
        state[ctx] = next_state_LPS[state[ctx] ] ;
    }
    encode_renorm( ) ;
    C++;
}
void encode_equiprob_event(int b) {
    L <<= 1;
    if (b)
        L += R;
    if (L +R < 0x400)
        bit_plus_follow(0) ;
    else if (L >= 0x400) {
        bit_plus_follow(1) ;
        L -= 0x400;
    }
    else {
        BO++;
        L -= 0x200;
    }
}
```

-continued

```
    C++;
}
void encode_end_of_slice_flag(int b) {
    if (b == 0) {
        R-=2;
        L+=2;
        encode_renorm( ) ;
    }
}
```

In the code above, sending the first byte, which is part of the header, to a NAL unit is performed to indicate the type of data that is to follow. The NAL unit and its use are well known in the art.

The RBSP_to_EBSP() function call causes data to be inserted into the bitstream. More preferably, in one embodiment, a 03 Hex is inserted after the 0000 Hex bytes in the following patterns, for example, 000000, 000001, 000002, 000003, as a way to prevent a predetermined number of consecutive zeros from occurring in the bitstream. The result is that patterns of 000000 Hex, 000001 Hex and 000002 Hex do not appear in the compressed data and may be used as resynchronization markers. When the 000003 Hex pattern is encountered by a decoder, a reverse procedure removes the "03" from the bitstream.

Although one such use for the encoders and decoders discussed herein is in the encoding and decoding of video data, one skilled in the art would realize that the encoder and decoder described herein may be utilized in any situation where a sequence of events is compressed to an information sequence in the case of the encoder, and where such an information sequence is decompressed in the case of the decoder. Further, although the previous discussion of the encoder is in the context of processing a sequence of events comprising multiple binary events to an information sequence comprising at least one bit, and for the decoder is in the context of processing a sequence of information comprising at least one bit to a sequence of events comprising multiple binary events, that the encoder and decoder could operate on event sequences and information sequences comprised of events, which are M-ary in nature (i.e. each M-ary event represents more than one bit of data) using the teachings described herein, as would be appreciated by one skilled in the art.

An Exemplary Computer System

Figure 17:
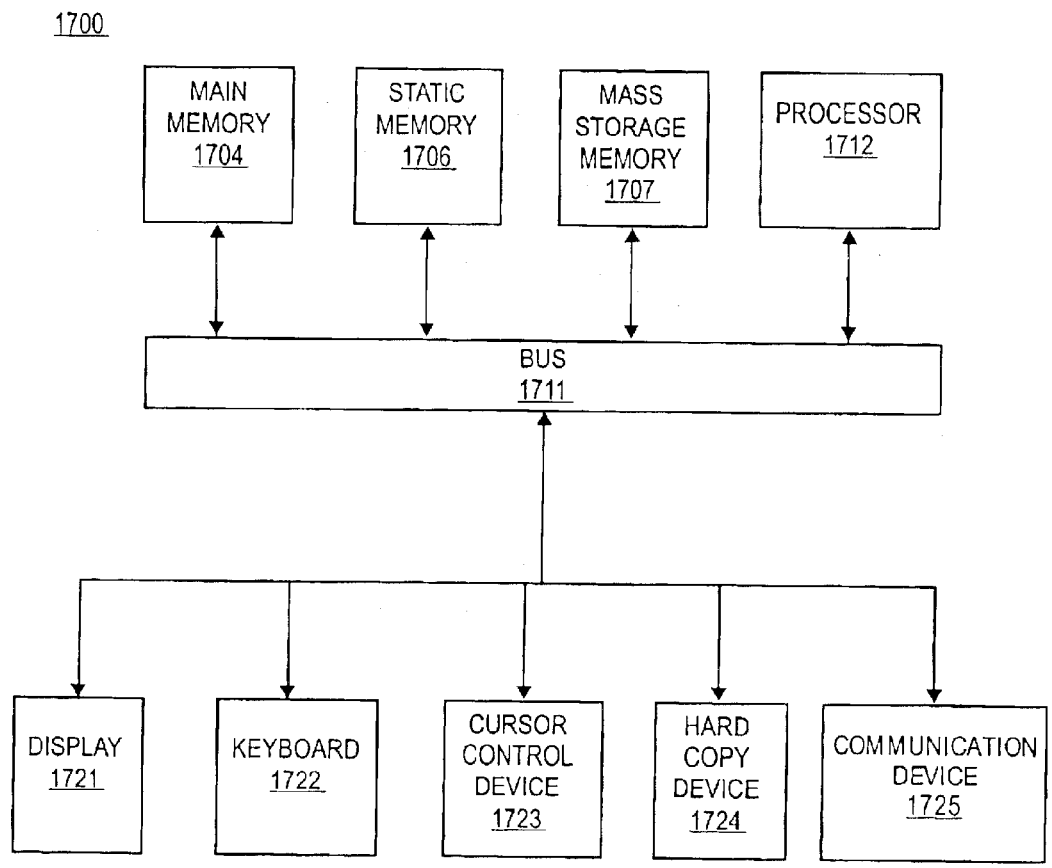
FIG. 17 is a block diagram of an exemplary computer system.

FIG. 17 is a block diagram of an exemplary computer system that may perform one or more of the operations described herein. Note that these blocks or a subset of these blocks may be integrated into a device such as, for example, a cell phone, to perform the techniques described herein.

Referring to FIG. 17, computer system 1700 comprises a communication mechanism or bus 1711 for communicating information, and a processor 1712 coupled with bus 1711 for processing information. Processor 1712 includes a microprocessor, but is not limited to a microprocessor, such as, for example, Pentium™, PowerPC™, Alpha™, etc.

System 1700 further comprises a random access memory (RAM), or other dynamic storage device 1704 (referred to as main memory) coupled to bus 1711 for storing information and instructions to be executed by processor 1712. Main memory 1704 also may be used for storing temporary variables or other intermediate information during execution of instructions by processor 1712.

Computer system 1700 also comprises a read only memory (ROM) and/or other static storage device 1706 coupled to bus 1711 for storing static information and instructions for processor 1712, and a data storage device 1707, such as a magnetic disk or optical disk and its corresponding disk drive. Data storage device 1707 is coupled to bus 1711 for storing information and instructions.

Computer system 1700 may further be coupled to a display device 1721, such as a cathode ray tube (CRT) or liquid crystal display (LCD), coupled to bus 1711 for displaying information to a computer user. An alphanumeric input device 1722, including alphanumeric and other keys, may also be coupled to bus 1711 for communicating information and command selections to processor 1712. An additional user input device is cursor control 1723, such as a mouse, trackball, trackpad, stylus, or cursor direction keys, coupled to bus 1711 for communicating direction information and command selections to processor 1712, and for controlling cursor movement on display 1721.

Another device that may be coupled to bus 1711 is hard copy device 1724, which may be used for printing instructions, data, or other information on a medium such as paper, film, or similar types of media. Furthermore, a sound recording and playback device, such as a speaker and/or microphone may optionally be coupled to bus 1711 for audio interfacing with computer system 1700. Another device that may be coupled to bus 1711 is a wired/wireless communication capability 1725 for communication to a phone, hand-held palm device, other device.

Note that any or all of the components of system 1700 and associated hardware may be used in the present invention. However, it can be appreciated that other configurations of the computer system may include some or all of the devices.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as essential to the invention.

I claim:

1. An arithmetic decoder comprising:
    a sequencer to generate a context identifier for an event of an event sequence; and
    a probability estimator to determine a value for a least probable symbol (LPS) and a probability estimate for the LPS; and
    a decoding engine including a range register to assign a value to a range for the LPS, wherein the value is based on the probability estimate, a value stored in the range register and the context identifier if the context identifier is not equal to an index and the value is not based on the value stored in range register if the context identifier is equal to the index, and the decoding engine further to determine a value of a binary event based on the value of the range for the LPS and bits from an information sequence.

2. The arithmetic decoder defined in claim 1 wherein the decoding engine stops decoding when the context identifier is equal to the index and a LPS is decoded.

3. The arithmetic decoder defined in claim 2 wherein non-arithmetically encoded data follows the arithmetically coded data in the information sequence.

4. The arithmetic decoder defined in claim 2 wherein the index represents an end of slice indicator.

5. The arithmetic decoder defined in claim 1 wherein the decoding engine includes a value register and when the context identifier is equal to the index decodes the event based on the value in the value register by generating an event in a first state if the value in the value register is less than the number assigned to the LPS range or generating an event in a second state if the value in the value register is greater than or equal to the number.

6. The arithmetic decoder defined in claim 5 wherein the decoding engine performs renormalization in response to decoding the event only when the value in the value register is greater than or equal to the number.

7. The arithmetic decoder defined in claim 1 wherein the decoding engine includes a value register and when the context identifier is equal to the index decodes the event by first subtracting the value assigned to the LPS range from the range register and, wherein the event is generated in a first state if the value in the value register is greater than or equal to a value in the range register or is generated in a second state if the value in the value register is less than the value in the range register.

8. The arithmetic decoder defined in claim 7 wherein the decoding engine performs renormalization in response to decoding the event only when the value in the value register is greater than or equal to the value in the range register.

9. The arithmetic decoder defined in claim 7 wherein the vehicle value assigned to the range of the LPS is 2 if the context identifier is equal to the index.

10. The arithmetic decoder defined in claim 8 wherein the value assigned to the range of the LPS is 100 Hex if the context identifier is equal to the index.

11. The arithmetic decoder defined in claim 7 wherein the value assigned to the range of the LPS is 2 if the context identifier is equal to the index and wherein a last bit read in a bitstream containing binary events being decoded by the decoding engine is equal to 1.

12. A decoding method comprising:
    generating a context identifier for a binary event of an event sequence;
    determining a value for a least probable symbol (LPS) and a probability estimate for the LPS;
    assigning a value to a range for the LPS, wherein the value is based on the probability estimate, a value stored in the range register and the context identifier if the context identifier is not equal to an index and the value is not based on the value stored in range register if the context identifier is equal to the index; and
    determining a value of a binary event based on the value of the range for the LPS and bits from an information sequence.

13. The method defined in claim 12 further comprising stopping decoding when the context identifier is equal to the index and a LPS is decoded.

14. The method defined in claim 12 wherein non-arithmetically coded data follows the arithmetically encoded data in the information sequence.

15. The method defined in claim 12 wherein the index represents an end of slice indicator.

16. The method defined in claim 12 wherein determining a value of a binary event based on the value of the range for the LPS and bits from an information sequence comprises decoding an event based on a value in a value register, when the context identifier is equal to the index, by generating an event in a first state if the value in the value register is less than the value assigned to the LPS range or by generating an event in a second state if the value in the value register is greater than or equal to the number.

17. The method defined in claim 16 further comprising performing renormalization in response to decoding the event only when the value in the value register is greater than or equal to the number.

18. The method defined in claim 12 wherein determining a value of a binary event based on the value of the range for the LPS and bits from an information sequence comprises decoding an event, when the context identifier is equal to the index, by first subtracting the value assigned to the LPS range from the range register and, where the event is generated in a first state if the value in the value register greater than or equal to a value in the range register or is generated in a second state if the value in the value register is less than the value in the range register.

19. The method defined in claim 18 further comprising performing renormalization in response to decoding the event only when the value in the value register is greater than or equal to the value in the range register.

20. The method defined in claim 18 wherein the value assigned to the range of the LPS is 2 if the context identifier is equal to the index.

21. The method defined in claim 19 wherein the value assigned to the range of the LPS is 100 Hex if the context identifier is equal to the index.

22. The method defined in claim 19 wherein the value assigned to the range of the LPS is 2 if the context identifier is equal to the index and wherein a last bit read in a bitstream containing binary events being decoded by the decoding engine is equal to 1.

23. An article of manufacture having one or more recordable media storing instructions thereon which, when executed by a system, cause the system to decode data by:
   generating a context identifier for a binary event;
   determining a value for a least probable symbol (LPS) and a probability estimate for the LPS;
   assigning a value to a range for the LPS, wherein the value is based on the probability estimate, a value stored in the range register and the context identifier if the context identifier is not equal to an index and the value is not based on the value stored in range register if the context identifier is equal to the index; and
   determining a value of a binary event based on the value of the range for the LPS and bits from an information sequence.

24. An arithmetic encoder comprising:
   a probability estimator to generate a probability estimate that each event of an event sequence has a particular value, wherein the probability estimator generates the probability estimate in response to corresponding context information for said each event; and
   a coding engine coupled to the probability estimator to generate zero or more bits of an information sequence in response to each event and its corresponding probability estimate, wherein the coding engine codes an event to signal the end of arithmetically encoded data in the information sequence using a constant for a subrange interval that is independent of a value of the range register prior to coding the end of slice signal.

25. The encoder defined in claim 24 wherein the coding engine using a constant to code the event to signal the end of the events in the event sequence enables inclusion of any remaining contents of a low register into the information sequence.

26. The encoder defined in claim 25 wherein the coding engine flushes any remaining contents of the low register and sets a last bit written during flushing equal to 1.

27. A method for encoding data, the method comprising:
   coding events in an event sequence to produce encoded data; and
   generating a bitstream using the encoded data, including coding an indicator for use when decoding to indicate an end of arithmetically encoded data in the bitstream.

28. The method defined in claim 27 wherein non-arithmetically coded data follows the arithmetically encoded data in the bitstream.

29. The method defined in claim 27 wherein coding the indicator comprises coding an event to signal the end of the slice.

30. The method defined in claim 27 wherein coding the event to signal the end of slice comprises using a constant for a subrange interval that is independent of a value of the range register prior to coding the end of slice signal.

31. The method defined in claim 30 wherein coding the event to signal the end of a slice using a constant enables flushing of any remaining contents of a low register into the information sequence.

32. The method defined in claim 31 wherein flushing any remaining contents of the low registers comprises setting a last bit written during flushing equal to 1.

33. An article of manufacture having one or more recordable media storing instructions thereon which, when executed by a system, cause the system to encode data by:
   coding events in an event sequence to produce encoded data; and
   generating a bitstream using the encoded data, including coding an event to signal an end of arithmetically encoded data in the bitstream using a constant for a subrange interval that is independent of a value of the range register prior to coding the end of slice signal.

34. The article of manufacture defined in claim 33 further comprising instructions which when executed by the system cause the system to flush contents of a low register, including setting a last bit written during flushing equal to 1.

35. An apparatus for encoding data, the apparatus comprising:
   means for coding a block of data to produce encoded data; and means for generating a bitstream using the encoded data, including means for wherein the coding engine codes an event to signal an end of arithmetically encoded data in the bitstream using a constant for a subrange interval that is independent of a value of the range register prior to coding the end of slice signal.

* * * * *